United States Patent
Kobayashi et al.

(10) Patent No.: US 10,606,166 B2
(45) Date of Patent: Mar. 31, 2020

(54) SUBSTRATE WITH ELECTRICALLY CONDUCTIVE FILM, SUBSTRATE WITH MULTILAYER REFLECTIVE FILM, REFLECTIVE MASK BLANK, REFLECTIVE MASK, AND METHOD OF MANUFACTURING SEMICONDUCTOR DEVICE

(71) Applicant: HOYA CORPORATION, Tokyo (JP)

(72) Inventors: Takumi Kobayashi, Tokyo (JP); Kazuhiro Hamamoto, Tokyo (JP); Tatsuo Asakawa, Tokyo (JP); Tsutomu Shoki, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 127 days.

(21) Appl. No.: 15/580,331

(22) PCT Filed: Jun. 8, 2016

(86) PCT No.: PCT/JP2016/067134
§ 371 (c)(1),
(2) Date: Dec. 7, 2017

(87) PCT Pub. No.: WO2016/204051
PCT Pub. Date: Dec. 22, 2016

(65) Prior Publication Data
US 2018/0149962 A1 May 31, 2018

(30) Foreign Application Priority Data
Jun. 17, 2015 (JP) .................. 2015-121712

(51) Int. Cl.
*G03F 1/40* (2012.01)
*G03F 1/24* (2012.01)
*G03F 1/54* (2012.01)

(52) U.S. Cl.
CPC .................. *G03F 1/40* (2013.01); *G03F 1/24* (2013.01); *G03F 1/54* (2013.01)

(58) Field of Classification Search
CPC .................. G03F 1/24; G03F 1/40; G03F 1/54
USPC ............................................. 430/5
See application file for complete search history.

(56) References Cited

U.S. PATENT DOCUMENTS

| | | |
|---|---|---|
| 2007/0160874 A1 | 7/2007 | Hayashi et al. |
| 2009/0253055 A1 | 10/2009 | Hayashi et al. |
| 2010/0304283 A1 | 12/2010 | Hayashi et al. |
| 2014/0295330 A1 | 10/2014 | Pruneri et al. |

FOREIGN PATENT DOCUMENTS

| | | |
|---|---|---|
| JP | 4978626 B2 | 7/2012 |
| JP | 4994405 B2 | 8/2012 |
| JP | 5082857 B2 | 11/2012 |
| JP | 2014-532313 A | 12/2014 |
| WO | 2009/116348 A1 | 9/2009 |

OTHER PUBLICATIONS

International Search Report of PCT/JP2016/067134 dated Aug. 23, 2016.
"The Role of Tribology in Friction and Contact Area", dated Jul. 23, 2018; https://www.azom.com/article.aspx?ArticleID=16333. Retrieved on Nov. 5, 2019; 9 pages.
"Fused quartz", Wikipedia article available at https://en.wikipedia.org/w/index.php?title=Fused_quartz&oldid=922827061 (last edited Oct. 24, 2019, 6 pp.).
TW105118976, "Office Action" dated Dec. 5, 2019 (5 pp.), with Machine Translation (5 pp).

*Primary Examiner* — Christopher G Young
(74) *Attorney, Agent, or Firm* — Kilpatrick Townsend & Stockton LLP

(57) ABSTRACT

A substrate with an electrically conductive film for fabricating a reflective mask is obtained that is capable of preventing positional shift of the reflective mask during pattern transfer. Provided is a substrate with an electrically conductive film used in lithography, the substrate with an electrically conductive film having an electrically conductive film formed on one of the main surfaces of a mask blank substrate, and a coefficient of static friction of the surface of the electrically conductive film is not less than 0.25.

20 Claims, 5 Drawing Sheets

(a)

(b)

SUBSTRATE WITH ELECTRICALLY CONDUCTIVE FILM, SUBSTRATE WITH MULTILAYER REFLECTIVE FILM, REFLECTIVE MASK BLANK, REFLECTIVE MASK, AND METHOD OF MANUFACTURING SEMICONDUCTOR DEVICE

CROSS REFERENCE TO RELATED APPLICATIONS

This application is a National Stage of International Application No. PCT/JP2016/067134 filed Jun. 8, 2016, claiming priority based on Japanese Patent Application No. 2015-121712 filed Jun. 17, 2015, the contents of all of which are incorporated herein by reference in their entirety.

TECHNICAL FIELD

The present invention relates to a substrate with an electrically conductive film used in EUV lithography, a substrate with a multilayer reflective film, a reflective mask blank, a reflective mask and a method of manufacturing a semiconductor device.

BACKGROUND ART

Accompanying the increasingly higher levels of integration of semiconductor devices in the semiconductor industry in recent years, there is a need for fine patterns that exceed the transfer limitations of conventional photolithography methods using ultraviolet light. Extreme ultraviolet (EUV) lithography is considered to be promising as an exposure technology that uses EUV light to enable the formation of such fine patterns. Here, EUV light refers to light in the wavelength band of the soft X-ray region or vacuum ultraviolet region, and more specifically, light having a wavelength of about 0.2 nm to 100 nm. Reflective masks have been proposed as transfer masks for use in this EUV lithography. Such reflective masks have a multilayer reflective film that reflects exposure light formed on a substrate, and an absorber film that absorbs exposure light formed in the form a pattern on the multilayer reflective film.

The reflective mask is fabricated from a reflective mask blank having a substrate, a multilayer reflective film formed on the substrate, and an absorber film formed on the multilayer reflective film, by forming an absorber film pattern by photolithography and the like.

Deposition of a multilayer film and absorption layer is formed by a deposition method such as sputtering. During this deposition, the reflective mask blank substrate is supported within a deposition device by a support means. An electrostatic chuck is used for the substrate support means. Consequently, in order to proceed immobilization of the substrate by the electrostatic chuck, an electrically conductive film (a back side electrically conductive film) is formed on the back side of a glass substrate or other insulated reflective mask blank substrate (side on the opposite side from the surface having a multilayer reflective film and the like formed thereon).

Patent Literature 1 describes an example of a substrate with an electrically conductive film that is used to fabricate reflective masks for EUV lithograph, wherein the electrically conductive film is characterized in that it contains chromium (Cr) and nitrogen (N), the average concentration of N in the electrically conductive film is 1 at % to less than 40 at %, crystalline state of at least the front side of the electrically conductive film is amorphous, the surface roughness (Rms) of the electrically conductive film is 0.5 nm or less, and the electrically conductive composition employs a graded composition in which the concentration of N in the electrically conductive film changes in the direction of thickness of the electrically conductive film so that the N concentration is lower on the substrate side and is higher on the surface side.

Patent Literature 2 describes a substrate with an electrically conductive film used in the fabrication of reflective mask blanks for EUV lithography, wherein the main material of this electrically conductive film is at least one material selected from the group consisting of Cr, Ti, Zr, Nb, Ni and V, the electrically conductive film contains B (boron) at an average concentration of 1 at % to 70 at %, and the electrically conductive film employs a graded composition in which the concentration of B in the electrically conductive film changes moving in the direction of thickness of the electrically conductive film so that the average concentration of B is lower on the substrate side and the average concentration of B is higher on the surface side.

Patent Literature 3 describes a friction coefficient measuring apparatus comprising a frictional force generation means and a compression load generation means for generating a compression load.

PRIOR ART LITERATURE

Patent Literature

Patent Literature 1: JP 4978626 B
Patent Literature 2: JP 5082857 B
Patent Literature 3: JP 4994405 B

DISCLOSURE OF THE INVENTION

Problems to be Solved by the Invention

In an exposure apparatus for carrying out pattern transfer, light that has entered a reflective mask placed in the exposure apparatus is absorbed at those locations where an absorber film pattern is present, and is reflected by a multilayer reflective film at those locations where an absorber film pattern is not present. The reflected optical image is transferred to a silicon wafer or other semiconductor substrate through a reflective optical system. Transfer methods employed by pattern transfer apparatuses equipped with a reflective mask (reticle) consist mainly of a step-and-repeat system in which a transferred region on a semiconductor substrate is exposed to a repeating pattern while successively shifting the position thereof, and a step-and-scan system in which the reticle and wafer are simultaneously scanned by a projection optical system to project a repeating pattern thereon and expose to the repeating pattern. These methods result in the formation of a prescribed number of integrated circuit chip regions within the semiconductor substrate.

In the aforementioned pattern transfer apparatus, when production efficiency is attempted to be improved by increasing the movement speed of the stage on which the reflective mask is placed, the positional shift of the reflective mask during pattern transfer becomes large, thereby resulting in the problem of preventing highly precise pattern transfer.

Therefore, an object of the present invention is to allow the obtaining of a reflective mask capable of preventing positional shift of the reflective mask during pattern transfer in a pattern transfer apparatus in the case of increasing the movement speed of the stage on which the reflective mask is placed. In addition, an object of the present invention is to allow the obtaining of a reflective mask blank, a substrate with a multilayer reflective film, and a substrate with an electrically conductive film capable of preventing positional shift of a reflective mask in order to fabricate a reflective mask capable of preventing positional shift of the reflective mask during pattern transfer.

In addition, an object of the present invention is to allow the obtaining of a method of manufacturing a semiconductor device capable of inhibiting positional shift of a reflective mask during pattern transfer in a pattern transfer apparatus in the case of increasing the movement speed of a stage on which the reflective mask is placed.

Means for Solving the Problems

Pattern transfer apparatuses are normally provided with an electrostatic chuck for immobilizing a reflective mask placed on a stage. A back side electrically conductive film formed on the back side of the reflective mask is immobilized on the stage of the pattern transfer apparatus by the electrostatic chuck.

As a result of focusing on the coefficient of static friction of the surface of an electrically conductive film of a reflective mask stuck to a stage by an electrostatic chuck, the inventors of the present invention found that positional shift of the reflective mask during pattern transfer can be inhibited by making the coefficient of static friction of the surface of the electrically conductive film to be equal to or greater than a prescribed value, thereby leading to completion of the present invention.

The present invention employs the following configurations to solve the aforementioned problem. The present invention provides a substrate with an electrically conductive film of the following Configurations 1 to 4, a substrate with a multilayer reflective film of the following Configurations 5 and 6, a reflective mask blank of the following Configuration 7, a reflective mask of the following Configuration 8, and a method of manufacturing a semiconductor device of the following Configuration 9.

(Configuration 1)

Configuration 1 of the present invention is a substrate with an electrically conductive film having an electrically conductive film formed on one of the main surfaces of a mask blank substrate used in lithography, wherein a coefficient of static friction of the surface of the electrically conductive film is not less than 0.25.

A reflective mask can be fabricated using the substrate with an electrically conductive film of Configuration 1 of the present invention. Since the coefficient of static friction of the surface of the electrically conductive film of Configuration 1 of the present invention is a value within a prescribed range, positional shift of the reflective mask during pattern transfer can be inhibited even in the case of increasing the movement speed of the stage on which the reflective mask is placed.

(Configuration 2)

Configuration 2 of the present invention is the substrate with an electrically conductive film described in Configuration 1, wherein the electrically conductive film is composed of a material containing at least one material selected from tantalum and chromium.

According to Configuration 2 of the present invention, as a result of the electrically conductive film being composed of a material containing at least one material selected from tantalum and chromium, an electrically conductive film can be obtained that demonstrates electrical properties (sheet resistance) required for use as a back surface electrically conductive film of a reflective mask.

(Configuration 3)

Configuration 3 of the present invention is the substrate with an electrically conductive film described in Configuration 1, wherein the electrically conductive film is composed of a material containing tantalum and boron.

According to Configuration 3 of the present invention, as a result of the electrically conductive film being composed of a material containing tantalum and boron, an electrically conductive film can be obtained that demonstrates wear resistance and chemical resistance.

(Configuration 4)

Configuration 4 of the present invention is the substrate with an electrically conductive film described in any of Configurations 1 to 3, wherein the surface roughness (Rms) of the electrically conductive film is not more than 0.60 nm.

In the substrate with an electrically conductive film of Configuration 4 of the present invention, particle generation caused by rubbing between an electrostatic chuck and the electrically conductive film can be prevented by making the surface roughness (Rms) of the electrically conductive film to be not more than 0.60 nm.

(Configuration 5)

Configuration 5 of the present invention is a substrate with a multilayer reflective film having a multilayer reflective film formed on a main surface on the opposite side from the side on which the electrically conductive film of the substrate with an electrically conductive film described in any of Configurations 1 to 4, wherein the multilayer reflective film is an alternately laminated layer of a high refractive index layer and a low refractive index layer.

According to Configuration 5 of the present invention, EUV light of a prescribed wavelength can be reflected by a prescribed multilayer reflective film.

(Configuration 6)

Configuration 6 of the present invention is the substrate with a multilayer reflective film described in Configuration 5, wherein a protective film is formed on the multilayer reflective film.

According to Configuration 6 of the present invention, as a result of a protective film being formed on a multilayer reflective film, damage to the surface of the multilayer reflective film can be inhibited during fabrication of a reflective mask (EUV mask) using a substrate with a multilayer reflective film, thereby resulting in favorable reflectance properties with respect to EUV light.

(Configuration 7)

Configuration 7 of the present invention is a reflective mask blank having an absorber film formed on the multilayer reflective film of the substrate with a multilayer reflective film described in Configuration 5 or on the protective film described in Configuration 6.

According to Configuration 7 of the present invention, since an absorber film of a reflective mask blank is able to absorb EUV light, a reflective mask (EUV mask) can be fabricated by patterning the absorber film of the reflective mask blank.

(Configuration 8)

Configuration 8 of the present invention is a reflective mask having an absorber pattern on a multilayer reflective film by patterning the absorber film of the reflective mask blank described in Configuration 7. Furthermore, "having an absorber pattern on a multilayer reflective film" includes the case of a protective film being interposed on the multilayer reflective film. Namely, this includes the case of forming a protective film on the multilayer reflective film, and having the absorber film on the protective film.

According to the reflective mask of Configuration 8 of the present invention, a prescribed pattern can be transferred to a transferred substrate using EUV light as a result of having an absorber pattern on a multilayer reflective film. In addition, positional shift of the reflective mask can be inhibited during pattern transfer in a pattern transfer apparatus even in the case of increasing the movement speed of a stage on which the reflective mask is placed.

(Configuration 9)

Configuration 9 of the present invention is a method of manufacturing a semiconductor device comprising a step for forming a transfer pattern on a transferred substrate by carrying out a lithography process with an exposure apparatus using the reflective mask described in Configuration 8.

According to the method of manufacturing a semiconductor device of Configuration 9 of the present invention, since positional shift of a reflective mask during pattern transfer can be inhibited, a semiconductor device can be manufactured having a fine and highly precise transfer pattern.

Effects of the Invention

According to the present invention, a reflective mask can be obtained that is capable of inhibiting positional shift of the reflective mask during pattern transfer in a pattern transfer apparatus in the case of increasing the movement speed of a stage on which the reflective mask is placed. In addition, according to the present invention, a reflective mask blank, substrate with a multilayer reflective film and substrate with an electrically conductive film can be obtained for fabricating a reflective mask capable of inhibiting positional shift of the reflective mask during pattern transfer.

In addition, the present invention allows the obtaining of a method of manufacturing a semiconductor device capable of inhibiting positional shift of a reflective mask during pattern transfer in a pattern transfer apparatus even in the case of increasing the movement speed of a stage on which the reflective mask is placed.

EMBODIMENTS FOR CARRYING OUT THE INVENTION

The present invention is a substrate with an electrically conductive film having an electrically conductive film formed on one of the main surfaces of a mask blank substrate. The main surface of the mask blank substrate on which the electrically conductive film (also referred to as a "back side electrically conductive film") is formed refers to the back side. In addition, the present invention is a substrate with a multilayer reflective film having a multilayer reflective film, obtained by alternately laminating a high refractive index layer and low refractive index layer, on the main surface on which the electrically conductive film of the substrate with an electrically conductive film is not formed (to also be simply referred to as the "front surface").

In addition, the present invention is a reflective mask blank having a mask blank multilayer film containing an absorber film on a multilayer reflective film of a substrate with a multilayer reflective film.

Figure 2:
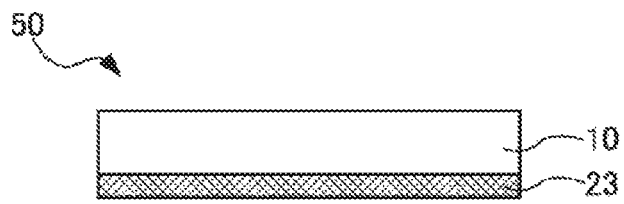
FIG. 2 is a cross-sectional schematic diagram showing one example of the configuration of a substrate with an electrically conductive film according to one embodiment of the present invention.

FIG. 2 is a schematic diagram showing on example of a substrate with an electrically conductive film 50 of the present invention. The substrate with an electrically conductive film 50 of the present invention has a structure in which a back side electrically conductive film 23 is formed on the back side of a mask blank substrate 10. Furthermore, in the present description, the substrate with electrically conductive film 50 refers to that in which the back side electrically conductive film 23 is formed on at least the back side of the mask blank substrate 10, and that in which a multilayer reflective film 21 is formed on the other main surface (substrate with a multilayer reflective film 20), as well as that in which an absorber film 24 is formed (such as a reflective mask blank 30), are included in the substrate with an electrically conductive film 50. In the present description, the back side electrically conductive film 23 may simply be referred to as the electrically conductive film 23.

Figure 7:
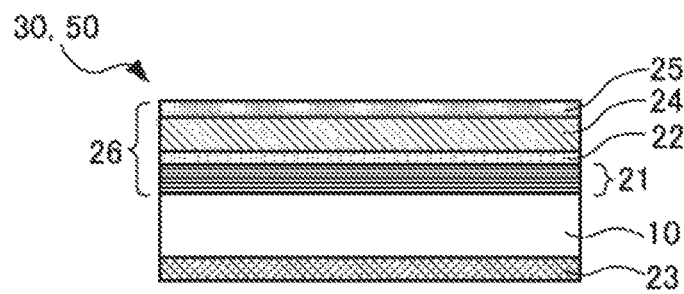
FIG. 7 is a cross-sectional schematic diagram showing another example of the configuration of a reflective mask blank according to one embodiment of the present invention.

FIG. 7 is a schematic diagram showing an example of the reflective mask blank 30 of the present invention. The reflective mask blank 30 of the present invention has a mask blank multilayer film 26 on a main surface of the mask blank substrate 10. In the present description, the mask blank multilayer film 26 refers to a plurality of films containing the multilayer reflective film 21 and the absorber film 24 formed by laminating on a main surface of the mask blank substrate 10. The mask blank multilayer film 26 can further contain a protective film 22, formed between the multilayer reflective film 21 and the absorber film 24, and/or an etching mask film 25 formed on the surface of the absorber film 24. In the case of the reflective mask blank 30 shown in FIG. 7, the mask blank multilayer film 26 on a main surface of the mask blank substrate 10 has the multilayer reflective film 21, the protective film 22, the absorber film 24 and the etching mask film 25. Furthermore, in the case of using the reflective mask blank 30 having the etching mask film 25, the etching mask film 25 may be stripped after having formed a transfer pattern on the absorber film 24. In addition, a laminated structure comprising a plurality of layers of the absorber film 24 may be employed in the reflective mask blank 30 where the etching mask 25 is not formed, materials may be employed such that the materials composing the plurality of layers have mutually different etching properties, and the reflective mask blank 30 may employ the absorber film 24 having an etching mask function. In addition, the reflective mask blank 30 of the present invention contains the back side electrically conductive film 23 on the back side thereof. Thus, the reflective mask blank 30 shown in FIG. 7 is a type of substrate with an electrically conductive film 50.

In the present description, "having the mask blank multilayer film 26 on a main surface of the mask blank substrate 10" not only includes the case of the mask blank multilayer film 26 being arranged in contact with the surface of the mask blank substrate 10, but also the case of having another film between the mask blank substrate 10 and the mask blank multilayer film 26. This applies similarly to other films as well. In addition, in the present description, "a film A being arranged in contact with the surface of a film B", for example, refers to the film A and the film B being arranged in direct contact without interposing another film between the film A and the film B.

Figure 5:
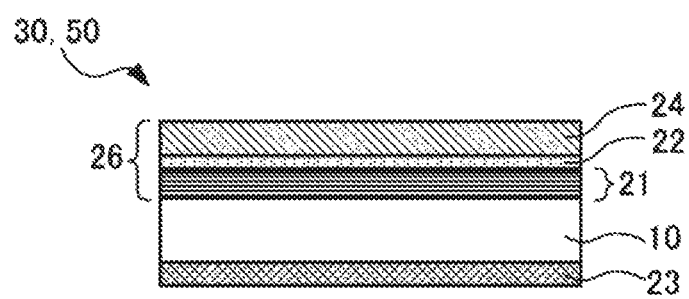
FIG. 5 is a cross-sectional schematic diagram showing one example of the configuration of a reflective mask blank according to one embodiment of the present invention.

FIG. 5 is a schematic diagram showing another example of the reflective mask blank 30 of the present invention. In the case of the reflective mask blank 30 shown in FIG. 5, although the mask blank multilayer film 26 has the protective film 22 and the absorber film 24, it does not have the etching mask film 25. In addition, the reflective mask blank 30 of FIG. 5 contains the back side electrically conductive film 23 on the back side thereof. Thus, the reflective mask blank 30 shown in FIG. 5 is a type of substrate with an electrically conductive film 50.

Figure 3:
FIG. 3 is a cross-sectional schematic diagram showing one example of the configuration of a substrate with a multilayer reflective film according to one embodiment of the present invention.
Figure 4:
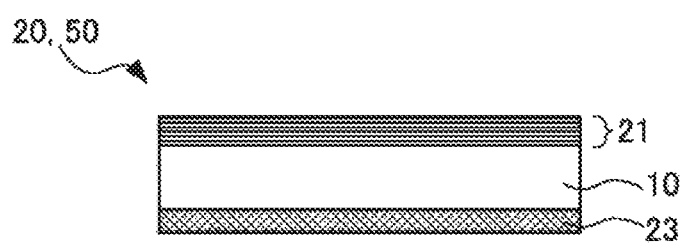
FIG. 4 is a cross-sectional schematic diagram showing one example of the configuration of a substrate with a multilayer reflective film according to one embodiment of the present invention.

FIG. 3 shows an example of the substrate with a multilayer reflective film 20. The multilayer reflective film 21 is formed on a main surface of the substrate with a multilayer reflective film 20 shown in FIG. 3. FIG. 4 shows the substrate with a multilayer reflective film 20 having the back side electrically conductive film 23 formed on the back side thereof. Since the substrate with a multilayer reflective film 20 shown in FIG. 4 contains the back side electrically conductive film 23, it is also a type of substrate with an electrically conductive film 50.

Next, an explanation is provided of the substrate with an electrically conductive film 50 of the present invention.

The present invention is a substrate with an electrically conductive film 50 used in lithography, having the electrically conductive film 23 (back side electrically conductive film 23) formed one of the main surfaces (back side) of the mask blank substrate 10 used in lithography. The substrate with an electrically conductive film 50 of the present invention is characterized in that the coefficient of static friction of the surface of the electrically conductive film 23 is not less than 0.25 and preferably not less than 0.30. There are no particular limitations of the upper limit of the coefficient of static friction of the surface of the electrically conductive film 23.

The reflective mask 40 can be fabricated using the substrate with an electrically conductive film 50 of the present invention. The coefficient of static friction of the surface of the electrically conductive film 23 of the substrate with the electrically conductive film 50 of the present invention is a value within a specific range. Consequently, positional shift of the reflective mask 40 can be inhibited during pattern transfer in a pattern transfer apparatus even in the case of increasing the movement speed of the stage on which this reflective mask 40 is placed. A method for measuring the coefficient of static friction of the surface of the electrically conductive film 23 will be subsequently described.

The coefficient of static friction of the electrically conductive film 23 can be controlled by changing the deposition conditions of the electrically conductive film 23. In general, the electrically conductive film 23 can be deposited by sputtering. For example, the coefficient of static friction of the electrically conductive film 23 can be controlled by controlling the type and pressure of gas used during sputtering deposition at the time of deposition even for electrically conductive films 23 of the same material. More specifically, in the case of using a rare gas for the gas used during sputtering deposition, by using a gas such as krypton (Kr) and/or xenon (Xe) having a larger atomic weight than argon (Ar), the real contact area of the surface of the electrically conductive film 23 can be increased, and this is thought to enable the coefficient of static friction to be increased. As a result, frictional force between the surface of the electrically conductive film 23 and the sticking holding surface of the electrostatic chuck can be increased, thereby making it possible to inhibit positional shift of the reflective mask 40 during pattern transfer.

In addition, in addition to the type of gas used during sputtering deposition, the coefficient of static friction of the surface of the electrically conductive film 23 can also be controlled by controlling such factors as the gas flow rate ratio (in the case of using a plurality of types of gas) or gas pressure. In addition, the coefficient of static friction of the surface of the electrically conductive film 23 can also be controlled by controlling the film thickness of the electrically conductive film 23.

In addition, the coefficient of static friction of the surface of the electrically conductive film 23 can also be controlled by controlling the morphology of a main surface of the mask blank substrate 10 on which the electrically conductive film 23 is formed. Namely, the morphology of the main surface can be controlled, which makes it possible to control the coefficient of static friction of the surface of the electrically conductive film 23, by suitably selecting the material of the mask blank substrate 10, the processing conditions of the substrate surface, such as a polishing condition and a treatment method used for the main surface.

In addition, the coefficient of static friction of the surface of the electrically conductive film 23 can also be controlled by controlling an intermediate film, such as a hydrogen penetration inhibiting film, able to be arranged between the mask blank substrate 10 and the electrically conductive film 23. Namely, the coefficient of static friction of the surface of the electrically conductive film 23 formed on an intermediate film can be controlled by controlling the intermediate film by suitably selecting such factors as the composition and film thickness of the intermediate film, and type of gas, gas flow rate ratio and gas pressure used during sputtering deposition.

Next, an explanation is provided of surface roughness (Rms), which is used as a parameter that indicates the surface morphology of the electrically conductive film 23 (back side electrically conductive film 23).

First, room mean square (Rms), which is a typical indicator of surface roughness, refers to the root mean square roughness, and is the square root of the value obtained by averaging the square of the deviation from an average line to a measurement curve. Rms is represented by the following equation (1).

[Equation 1]

$$\text{Rms} = \sqrt{\frac{1}{l}\int_0^l Z^2(x)dx} \quad (1)$$

In equation (1), "l" represents a reference line length and Z represents the height from an average line to a measurement curve.

Rms has conventionally been used to manage surface roughness of the mask blank substrate 10, and surface roughness can be determined as a numerical value.

The root mean square roughness (Rms) obtained by measuring an area measuring 1 μm×1 μm on the surface of the back side electrically conductive film 23 with an atomic force microscope is preferably not more than 0.60 nm and more preferably not more than 0.40 nm.

Next, an explanation is provided of the method for measuring coefficient of static friction in the present invention. The coefficient of static friction of the back side electrically conductive film 23 can be measured using the method and apparatus described below.

Figure 8:
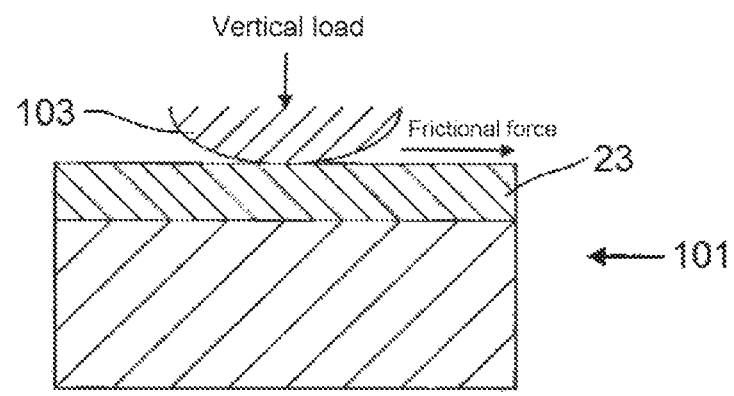
FIG. 8 is an explanatory drawing of compression load and frictional force applied for measuring coefficient of friction.

FIG. 8 shows an explanatory diagram of friction coefficient measurement. In the present invention, as shown in FIG. 8, coefficient of friction is measured by sliding at least one of a measured object 101 or probe 103 relative to the other with the probe 103 pressed against the surface of the electrically conductive film 23 (back side electrically conductive film 23) of the substrate with an electrically conductive film 50 (measured object 101). For example, the measured object 101 may be slid relative to the probe 103, or the probe 103 may be slid relative to the measured object 101. In the following explanation, the film serving as the measurement target of coefficient of friction (electrically conductive film 23) is referred to as the "measurement target film".

As shown in FIG. 8, the coefficient of friction is measured using the equation:

coefficient of friction=frictional force/compression load from the frictional force generated when the probe 103 is slid over a pressed surface (surface of the electrically conductive film 23 serving as the measured object 101) in the state in which a compression load (vertical load) is applied in the vertical direction to the pressed surface. The frictional force that acts when a stationary object is attempted to be moved is referred to as static frictional force, and the coefficient of friction relating to this static frictional force is referred to as the coefficient of static friction. The coefficient of static friction is measured in the present invention.

Although the following provides an explanation of a friction coefficient measuring apparatus preferably used in the present invention, the present invention is not limited to the aspect indicated below.

Figure 9:
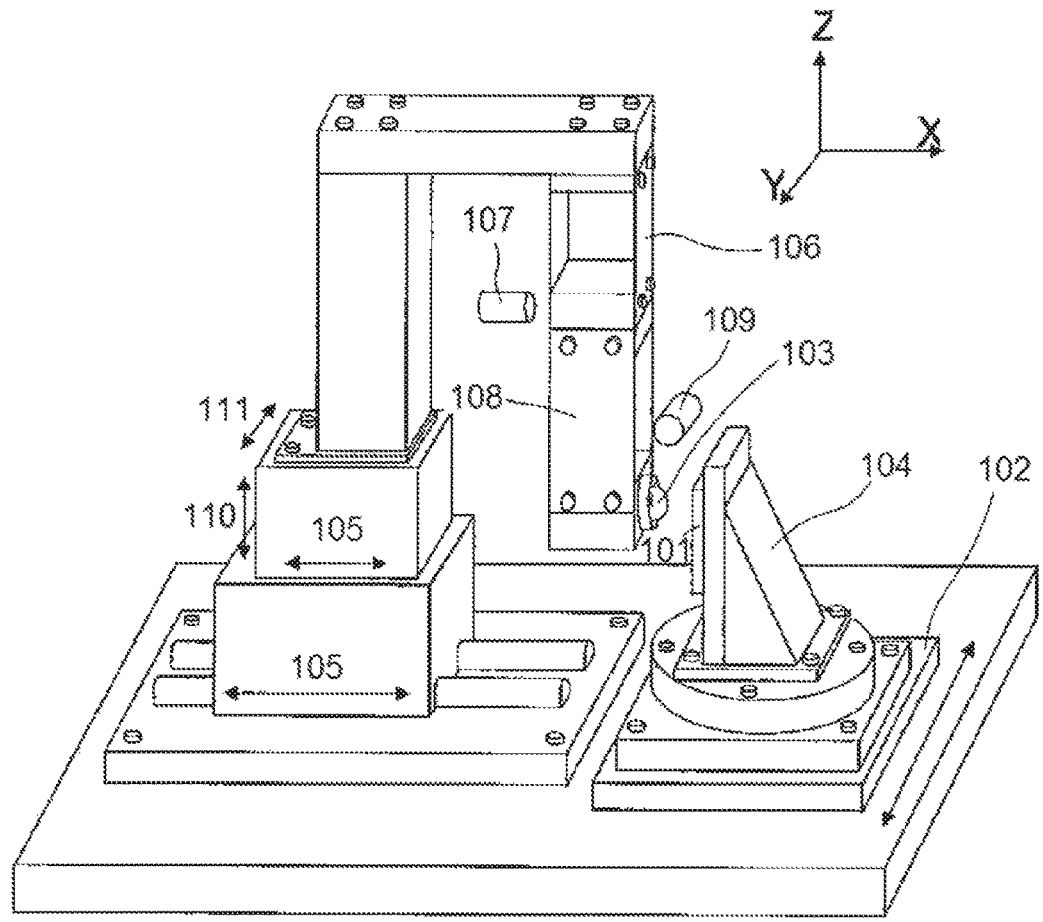
FIG. 9 is a perspective view showing the configuration of a friction coefficient measuring apparatus.

FIG. 9 is a schematic diagram of a friction coefficient measuring apparatus preferably used in the present invention. The apparatus shown in FIG. 9 comprises a frictional force generation means and a compression load generation means for generating a compression load. The following provides a detailed explanation of each means.

The frictional force generation means fulfills the role of a sample holder, which immobilizes and holds a sample having a measurement target film on the uppermost surface thereof, and a movable carriage, which moves the sample in an arbitrary direction. For example, frictional force can be generated by moving the sample in the horizontal direction (Y direction in FIG. 9) relative to the measurement target surface in a state in which the probe 103 is pressed against the measurement target surface. The probe 103 can be repeatedly slid over the measurement target surface by employing a configuration that enables reciprocating movement in an arbitrary direction such as the Y direction in FIG. 9. In the apparatus shown in FIG. 9, the probe 103 can be repeatedly slid over the measurement target surface by repeating an operation consisting of moving a shearing movement Y stage 102 back and forth in the Y direction in a state in which the probe 103 is pressed against the measurement target surface of the measured object 101 held on a sample holder 104. Alternatively, the probe 103 can also be repeatedly slid over the measurement target surface by moving the probe 103 back and forth without moving the shearing movement Y stage 102 back and forth.

The compression load generation means is able to press the probe 103 against the measurement target surface or release the pressure by employing a configuration that enables reciprocating movement in an arbitrary direction such as the X direction in FIG. 9. A configuration can also be employed that permits adjustment in two stages consisting of a coarse adjustment and fine adjustment in order to adjust the position of the probe 103. For example, in the apparatus shown in FIG. 9, the upper X stage for applying surface pressure 105 is a precision movement stage (for fine adjustment), while the lower X stage for applying surface pressure 105 is a coarse movement stage (for coarse movement).

In the apparatus shown in FIG. 9, the compression load generation means is able to immobilize the probe 103 through an X-direction elastic deformation member and a Y-direction elastic deformation member. Although both elastic deformation members can consist of a single sheet, those composed of a pair of leaf springs are used preferably. This is because in the case of composing with a pair of leaf springs, twisting of the elastic deformation members by vertical compressive stress and shear stress can be avoided. In FIG. 9, the surface pressure-displaced leaf springs 106 are equivalent to a pair of leaf springs serving as the X-direction elastic deformation member, while the frictional force-displaced leaf springs 108 are equivalent a pair of leaf springs serving as the Y-direction elastic deformation member.

The portion of the probe 103 that contacts the measurement target film during pressing preferably uses the same material as the material used for the surface sticking the reflective mask 40 by an electrostatic chuck in an exposure apparatus. This is to enable the coefficient of static friction to be measured in a state that more closely approximates the state in which the reflective mask 40 is placed in the exposure apparatus. Furthermore, in the present invention, the material of the portion of the probe 103 that contacts the measurement target film during pressing can be a TiN thin film deposited on the surface of a quartz piano-convex lens. A TiN thin film (thickness: 2.3 μm) is used for the material of the portion of the probe 103 that contacts the measurement target film during pressing in the examples to be subsequently described as well.

In addition, the shape of the portion of the probe 103 that contacts the measurement target film during pressing in the present invention is a spherical shape having a radius of curvature of 322 mm.

As was previously described, the measurement target film of the measured object 101 is the electrically conductive film 23 (back side electrically conductive film 23) formed on the back side of the mask blank substrate 10. Furthermore, in the apparatus of FIG. 9, the coefficient of friction is preferably measured for a sample film formed on a flat surface from the viewpoint of simplifying friction coefficient measurement (simplification of measurement of frictional force generated by the application of a compression load in the X direction of the probe 103 and movement in the Y direction in FIG. 9). Friction coefficient measurement can be simplified since the mask blank substrate 10 has a flat surface.

Displacement sensors capable of measuring displacement of each of the X- and Y-direction elastic deformation members can be disposed as compression load and shear stress measuring means. Vertical compressive stress applied to the measurement target surface and the amount of shear stress generated, namely frictional force, can be measured with a calibration curve (correlation data of the amount of displacement versus stress) by detecting the amount of displacement of each elastic deformation member with the displacement sensor. Alternatively, vertical compressive stress and frictional force can also be measured by using a load cell or other type of strain gauge. In the apparatus shown in FIG. 9, the displacement sensor for detecting surface pressure 107 and the displacement sensor for detecting frictional force 109 are equivalent to the aforementioned displacement sensors.

In addition, the relative movement speed during sliding of the measurement target film and probe 103 can be controlled by using a servo motor and the like.

On the basis of the above, correlation data of the operating status of a friction coefficient measuring apparatus versus vertical compressive stress applied to a measurement target surface and the amount of frictional force generated can be obtained.

Next, an explanation is provided of the method used to measure the coefficient of friction of a measurement target film (back side electrically conductive film 23).

First, a sample (measured object 101 having the electrically conductive film 23 such as the substrate with an electrically conductive film 50) is immobilized and held in the friction coefficient measurement apparatus shown in FIG. 9 so that the measurement target film is arranged on the uppermost surface. Next, the compression load generation means is adjusted so that the probe 103 makes contact at a desired location on the sample.

In the present invention, compressive stress applied to the measurement target film when pressed by the probe 103 is determined based on the surface pressure generated in the measurement target film (electrically conductive film 23) of the measured object 101.

The relative movement speed between the measurement target film and probe 103 of the apparatus shown in FIG. 9 is preferably set to an upper limit of about 1 mm/sec. In addition, a lower limit can be set for the relative movement speed provided there is relative movement during sliding (relative movement speed is not zero). In the present invention, the relative movement speed is set to 0.1 mm/sec from the viewpoint of obtaining reproducible measurement results. In addition, when considering conditions in the case the back side electrically conductive film 23 of the reflective mask 40 is clamped with an electrostatic chuck in an exposure apparatus, the load for imparting vertical compressive stress in the present invention is set to 10 mM.

The environment when measuring coefficient of friction according to the present invention is such that measurement is carried out in air at a temperature of 20° C. to 30° C. and relative humidity (RH) of 20% to 30%.

After determining the measurement conditions during friction coefficient measurement, the probe 103 is pressed against the measurement target surface so that the determined compressive stress is applied in the vertical direction (X direction in FIG. 9) relative to the measurement target surface. Frictional force is generated by reciprocating movement of the probe 103 over the measurement target surface at the determined relative movement speed (such as in the Y direction in FIG. 9) while in this state. Here, the generated frictional force can be calculated by, for example, multiplying the amount of deflection obtained with the displacement sensors by the spring constant of the leaf springs. The coefficient of friction can be calculated according to the following equation as previously explained.

Figure 10:
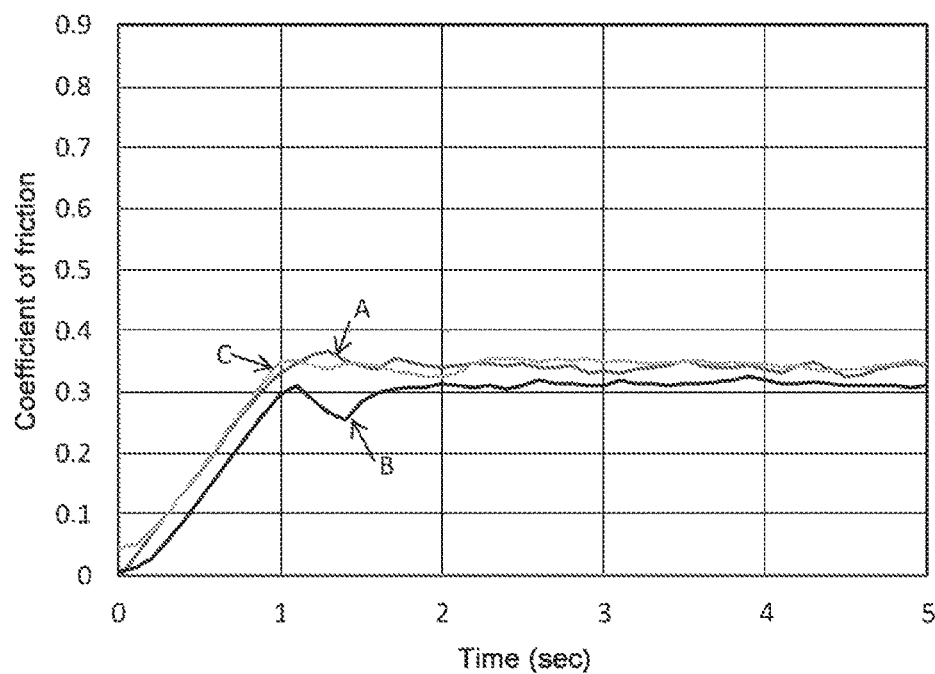
FIG. 10 is a graph showing one example of the results of measuring coefficient of friction with the apparatus shown in FIG. 9.

Coefficient of friction=calculated frictional force/measured vertical compressive stress The coefficient of static friction can be determined from frictional force when the probe 103 moves relative to the measurement target surface. More specifically, as shown in FIG. 10, the peak of the spike where the waveform has formed a spike after increasing linearly (maximum value immediately before the waveform begins to decrease after demonstrating a monotonic increase in the vicinity of a time of 1 second) is the coefficient of static friction. The values for static coefficient of friction obtained in the measurements shown in FIG. 10 consisted of 0.366 during the first measurement (A in FIG. 10), 0.352 during the second measurement (B in FIG. 10), and 0.352 during the third measurement (C in FIG. 10), and the average of the three measurements was 0.343. In the present invention, the average value of the results of measuring static coefficient of friction three times is used as the coefficient of static friction for that measurement. Thus, the coefficient of static friction of the example shown in FIG. 10 is 0.343.

Next, a detailed explanation is provided of the substrate with an electrically conductive film 50, the substrate with a multilayer reflective film 20, the reflective mask blank 30 and the reflective mask 40 of the present invention.

[Mask Blank Substrate 10]

First, the following provides an explanation of the mask blank substrate 10 used, for example, to fabricate the substrate with an electrically conductive film 50 of the present invention.

Figure 1:
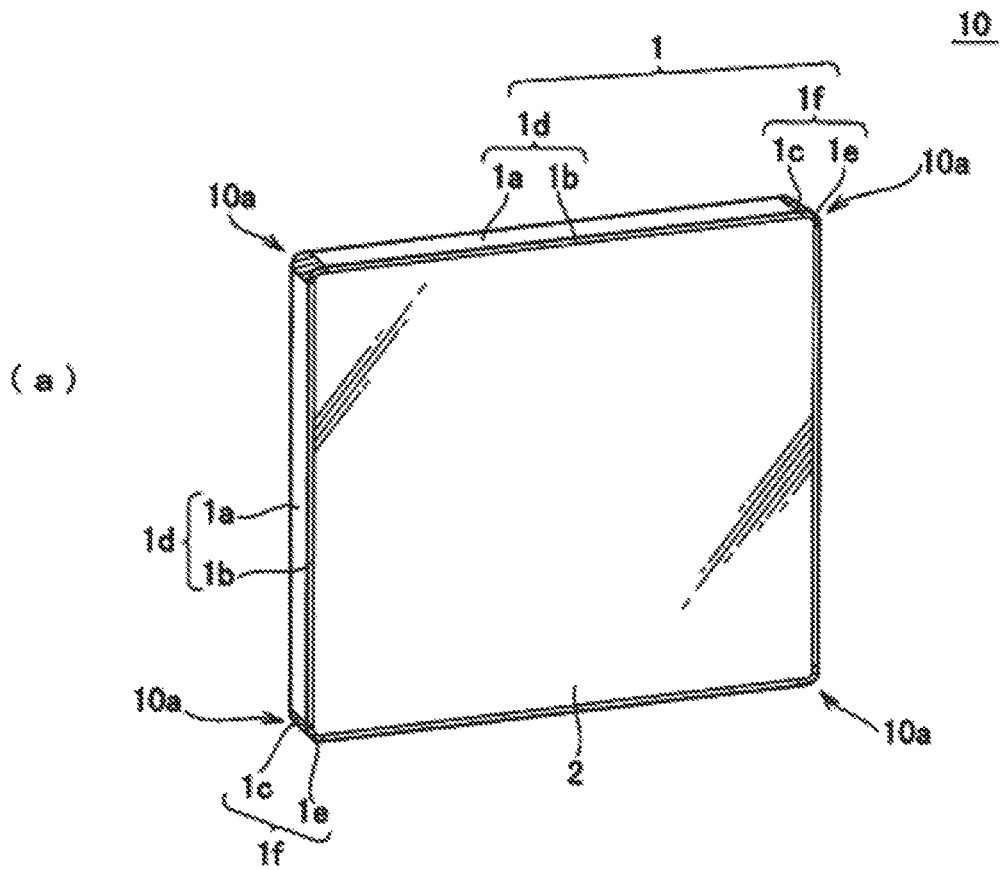
FIG. 1(a) is a perspective view showing a mask blank substrate.
FIG. 1(b) is a cross-sectional schematic diagram showing a mask blank substrate.
Figure 1:
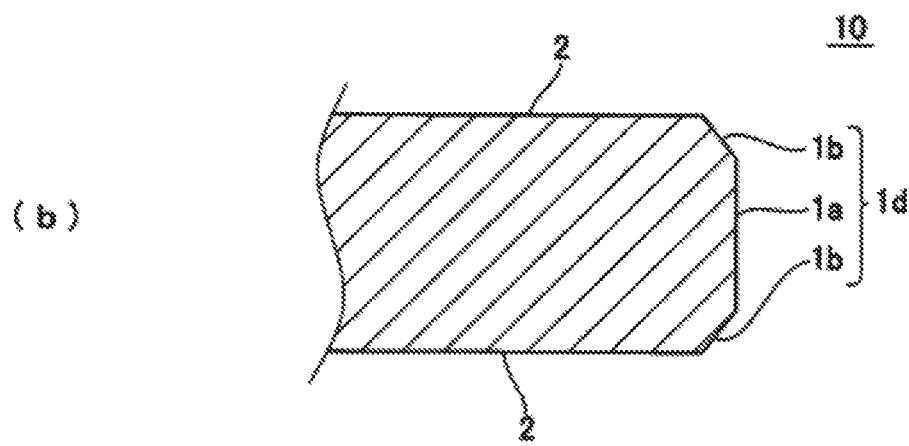

FIG. 1(a) is a perspective view showing an example of the mask blank substrate 10 able to be used to fabricate the substrate with an electrically conductive film 50 of the present invention. FIG. 1(b) is a cross-sectional schematic diagram of the mask blank substrate 10 shown in FIG. 1(a).

The mask blank substrate 10 (which may be simply referred to as the substrate 10) is a rectangular plate-like body, and has two opposing main surfaces 2 and an edge face 1. The two opposing main surfaces 2 constitute an upper surface and a lower surface of this plate-like body, and are formed so as to be mutually opposed. In addition, at least one of the two opposing main surfaces 2 is a main surface on which a transfer pattern is to be formed.

The edge face 1 constitutes the lateral surface of this plate-like body, and is adjacent to the outer edges of the opposing main surfaces 2. The edge face 1 has a flat edge face portion 1d and a curved edge face portion 1f. The flat edge face portion 1d is a surface that connects a side of one of the opposing main surface 2 and a side of the other opposing main surface 2, and comprises a lateral surface portion 1a and a chamfered surface portion 1b. The lateral surface portion 1a is a portion (T surface) that is nearly perpendicular to the opposing main surfaces 2 in the flat edge face portion 1d. The chamfered surface portion 1b is a portion (C surface) that is chamfered between the lateral surface portion 1a and the opposing main surfaces 2, and is formed between the lateral surface portion 1a and the opposing main surfaces 2

The curved edge face portion 1f is a portion (R portion) that is adjacent to the vicinity of a corner portion 10a of the substrate 10 when the substrate 10 is viewed from overhead, and comprises a lateral surface portion 1c and a chamfered surface portion 1e. Here, viewing the substrate 10 from overhead means that the substrate 10 is visible from, for example, a direction perpendicular to the opposing main surfaces 2. In addition, the corner portion 10a of the substrate 10 refers to, for example, the vicinity of the intersection of two sides along the outer edge of the opposing main surfaces 2. An intersection of two sides refers to the intersection of lines respectively extending from two sides. In the present example, the curved end face portion 1f is formed into a curved shape by rounding the corner portion 10a of the substrate 10.

A main surface of the mask blank substrate 10 is preferably a surface that has been processed by catalyst-referred etching. Catalyst-referred etching (to also be referred to as CARE) refers to a surface processing method involving arranging a processing target (mask blank substrate 10) and catalyst in a treatment liquid or supplying a treatment liquid between the processing target and the catalyst, allowing the processing target and catalyst to make contact, and processing the processing target with an active species generated from molecules in the treatment liquid that have been adsorbed onto the catalyst at that time. Furthermore, in the case the processing target is composed of a solid oxide such as glass, water is used for the treatment liquid, the processing target and the catalyst are allowed to make contact in the presence of the water, and the catalyst and surface of the processing target are allowed to undergo relative motion and the like to remove decomposition products of hydrolysis from the surface of the processing target.

The main surfaces of the mask blank substrate 10 are selectively processed by catalyst-referred etching starting from protrusions that contact a reference surface in the form of a catalyst surface. Consequently, surface irregularities (surface roughness) that compose the main surfaces retain an extremely high level of smoothness while having an extremely uniform surface morphology, and result in a surface morphology in which the proportion of concave portions that compose the main surfaces is greater than the proportion of convex portions with respect to the reference surface. Thus, in the case of laminating a plurality of thin films on the aforementioned main surfaces, since the size of defects on the main surfaces tends to become small, surface treatment by catalyst referred etching is preferably in terms of defect quality. This effect is especially demonstrated in the case of forming the multilayer reflective film 21 and the back side electrically conductive film 23 to be subsequently described on an aforementioned main surface in particular.

Furthermore, in the case the material of the substrate 10 is a glass material, at least one type of material selected from the group consisting of platinum, gold, transition metals and alloys comprising at least one of these materials can be used for the catalyst. In addition, at least one type of treatment liquid selected from the group consisting of pure water, functional water such as ozonated water or hydrogen water, low-concentration aqueous alkaline solutions and low-concentration aqueous acidic solutions can be used for the treatment liquid.

A main surface on the side of the mask blank substrate 10 used for the back side electrically conductive film 23 of the present invention on which a transfer pattern is formed is preferably processed so as to have high flatness at least from the viewpoints of obtaining pattern transfer accuracy and positional accuracy. In the case of an EUV reflective mask blank substrate 10, flatness in a region measuring 132 mm×132 mm or a region measuring 142 mm×142 mm on a main surface of the substrate 10 on the side on which a transfer pattern is formed is preferably not more than 0.1 µm and particularly preferably not more than 0.05 µm. Flatness in a region measuring 132 mm×132 mm on a main surface of the substrate 10 on which a transfer pattern is formed is more preferably not more than 0.03 µm. In addition, the main surface on the opposite side from the side on which a transfer pattern is formed is the side that is clamped with an electrostatic chuck when the substrate is placed in an exposure apparatus, and flatness in a region measuring 142 mm×142 mm is preferably not more than 1 µm and particularly preferably not more than 0.5 µm.

Any material may be used for the material of the reflective mask blank substrate 10 for EUV exposure provided it has low thermal expansion properties. For example, a $SiO_2$—$TiO_2$-based glass having low thermal expansion properties (such as a two-element system ($SiO_2$—$TiO_2$) or three-element system (such as $SiO_2$—$TiO_2$—$SnO_2$)), or a so-called multicomponent glass such as $SiO_2$—$Al_2O_3$—$Li_2O$-based crystallized glass, can be used. In addition, a substrate 10 other than the aforementioned glass made of silicon or metal and the like can also be used. An example of the aforementioned metal substrate 10 is an invar alloy (Fe—Ni-based alloy).

In addition, in order to reduce the number of mask pattern defects of an extremely small size, a pattern defect inspection is required using an electron beam having extremely high inspection sensitivity with respect to ultrafine patterns. In this defect inspection, since the occurrence of charge-up results in the risk of a decrease in inspection sensitivity or the occurrence of inspection errors, it is important to prevent the occurrence of charge-up. However, as a result of etching the multilayer reflective film 21, in the reflective mask 40 that forms a light shielding band, conductors in the form of the absorber film 24 and multilayer reflective film 21 are separated by the light shielding band, and since this causes portions where circuit patterns are formed to become electrically isolated and ground is no longer able to be secured, there is the risk of the occurrence of charge-up due to irradiation by the electron beam during defect inspections. Moreover, it is also necessary to make flatness of the surface of the base layer directly beneath the multilayer reflective film 21 extremely high in order to reduce defects in the multilayer reflective film 21. The reason for this is the problem of phase defects that were not present in light-transmitting masks. Minute surface irregularities in the surface of the base layer directly beneath the multilayer reflective film 21 become the source of disturbances (undulations) in the multilayer reflective film 21 formed thereon, resulting in the occurrence of a partial phase difference. This is because there is the risk of these surface irregularities becoming a source of critical defects due to a partial change in reflectance of the EUV light accompanying the occurrence of this partial phase difference. In addition, it is also necessary to inspect for defects in the multilayer reflective film 21 at an extremely high level of sensitivity in order to reduce defects in the multilayer reflective film 21. In order to accomplish this, it is necessary to reduce the levels of noise and false defects during inspection and ensure a high degree of flatness for the surface of the multilayer reflective film 21.

Consequently, it is preferable to form a base film on the surface of the substrate 10 for the purpose preventing charge-up during mask pattern defect inspections using an electron beam while also reducing phase defects in the multilayer reflective film 21 and obtaining high surface flatness. A material containing ruthenium or tantalum as the main component thereof is preferably used for the material of this base film. For example, this material may be Ru metal, Ta metal, or Ru alloys or Ta alloys containing a metal selected from titanium (Ti), niobium (Nb), molybdenum (Mo), zirconium (Zr), yttrium (Y), boron (B), lanthanum (La), cobalt (Co), rhenium (Re) and the like in combination with the Ru or Ta. The film thickness of the base film is preferably within the range of, for example, 1 nm to 10 nm.

[Substrate with Multilayer Reflective Film 20]

Next, an explanation is provided of the substrate with a multilayer reflective film 20 capable of being used in the substrate with an electrically conductive film 50 and reflective mask blank 30 of the present invention.

FIG. 3 is a schematic diagram showing an example of the substrate with a multilayer reflective film 20 of the present embodiment capable of being used for the back side electrically conductive film 23 and reflective mask blank 30 of the present invention. In addition, FIG. 4 shows a schematic diagram of another example of the substrate with multilayer reflective film 20 of the present invention. As shown in FIG. 4, in the case the substrate with a multilayer reflective film 20 has the prescribed back side electrically conductive film 23, this substrate with a multilayer reflective film 20 is a type of the substrate with a back side electrically conductive film 20 of the present invention. In the present description, these substrates with a multilayer reflective film 20 shown in both FIGS. 3 and 4 refer to the substrate with a multilayer reflective film 20 of the present embodiment.

The substrate with a multilayer reflective film 20 of the present invention has the multilayer reflective film 21, obtained by alternately laminating a high refractive index layer and a low refractive index layer, on the main surface on the opposite side from the side on which the back side electrically conductive film 23 is formed. The substrate with a multilayer reflective film 20 of the present invention is able to reflect EUV light of a prescribed wavelength as a result of having the prescribed multilayer reflective film 21.

Furthermore, as shown in FIG. 3, in the present invention, the multilayer reflective film 21 can be formed prior to forming the back side electrically conductive film 23. Furthermore, as shown in FIG. 2, the back side electrically conductive film 23 can be formed, and the multilayer reflective film 21 may then be subsequently formed as shown in FIG. 4.

The multilayer reflective film 21 imparts the function of reflecting EUV light to the reflective mask 40 for EUV lithography, and adopts a configuration in which elements having different refractive indices are cyclically laminated.

Although there are no particular limitations on the material of the multilayer reflective film 21 provided it reflects EUV light, the reflectance of the multilayer reflective film 21 alone is normally not less than 65% and the upper limit thereof is normally 73%. This type of multilayer reflective film 21 can typically be that of a multilayer reflective film 21 in which a thin film composed of a high refractive index material (high refractive index layer) and a thin film composed of a low refractive index material (low refractive index layer) are alternately laminated for about 40 to 60 cycles.

For example, the multilayer reflective film 21 for EUV light of a wavelength of 13 nm to 14 nm preferably consists of an Mo/Si cyclically laminated film obtained by alternately laminating about 40 cycles of an Mo film and Si film. In addition, the multilayer reflective film 21 used in the region of EUV light can consist of, for example, an Ru/Si cyclically laminated film, Mo/Be cyclically laminated film, Mo compound/Si compound cyclically laminated film, Si/Nb cyclically laminated film, Si/Mo/Ru cyclically laminated film, Si/Mo/Ru/Mo cyclically laminated film or Si/Ru/Mo/Ru cyclically laminated film.

Although the method used to form the multilayer reflective film 21 is known in the art, the multilayer reflective film 21 can be formed by depositing each layer by, for example, magnetron sputtering or ion beam sputtering. In the case of the aforementioned Mo/Si cyclically laminated film, an Si film having a thickness of about several nm is first deposited on the substrate 10 using an Si target by, for example, ion beam sputtering, followed by depositing an Mo film having a thickness of about several nm using an Mo target and laminating for 40 to 60 cycles, with this deposition comprising one cycle, to form the multilayer reflective film 21.

When fabricating the substrate with a multilayer reflective film 20 of the present embodiment, the multilayer reflective film 21 is preferably formed by ion beam sputtering by alternately emitting an ion beam onto a sputtering target of a high refractive index material and a sputtering target of a low refractive index material. The multilayer reflective film 21 having favorable reflectance properties with respect to EUV light can be reliably obtained by forming the multilayer reflective film 21 using a prescribed ion beam sputtering method.

The substrate with a multilayer reflective film 20 of the present embodiment preferably further contains the protective film 22 arranged in contact with the surface of the multilayer reflective film 21 on the opposite side from the mask blank substrate 10.

The protective film 22 (see FIG. 5) can be formed on the multilayer reflective film 21 formed in the manner described above to protect the multilayer reflective film 21 from dry etching or wet cleaning in the fabrication process of the reflective mask 40 for EUV lithography. In this manner, an aspect having the multilayer reflective film 21 and the protective film 22 on the mask blank substrate 10 can also constitute the substrate with a multilayer reflective film 20 of the present embodiment.

In the substrate with a multilayer reflective film 20 of the present invention, by forming the protective film 22 on the multilayer reflective film 21, reflectance properties with respect to EUV light are favorable since damage to the surface of the multilayer reflective film 21 can be inhibited when fabricating the reflective mask 40 using the substrate with a multilayer reflective film 20.

Furthermore, although materials such as Ru, Ru—(Nb, Zr, Y, B, Ti, La, Mo), Si—(Ru, Rh, Cr, B), Si, Zr, Nb, La or B can be used for the material of the aforementioned protective film 22, among these materials, reflectance properties of the multilayer reflective film 21 are more favorable if a material containing ruthenium (Ru) is applied. More specifically, the material of the protective film 22 is preferably Ru or Ru—(Nb, Zr, Y, B, Ti, La, Mo). This type of protective film 22 is particularly effective in the case of using a Ta-based material for the absorber film 24 and patterning the absorber film 24 by dry etching with a Cl-based gas.

In order to ensure favorable surface morphology of the multilayer reflective film 21 or the protective film 22, the multilayer reflective film 21 is preferably deposited by sputtering so that the high refractive index layer and the low refractive index layer accumulate on an angle to the normal of a main surface of the substrate 10. More specifically, the multilayer reflective film 21 is deposited by making the incident angle of sputtered particles for depositing the low refractive index layer consisting of Mo and the like and the incident angle of sputtered particles for depositing the high refractive index layer consisting of Si and the like to be greater than 0 degrees to not more than 45 degrees, more preferably greater than 0 degrees to not more than 40 degrees, and even more preferably greater than 0 degrees to not more than 30 degrees. Moreover, the protective layer 22 formed on the multilayer reflective film 21 is also preferably formed by ion beam sputtering in continuation therefrom so that the protective layer 22 accumulates on an angle to the normal of a main surface of the substrate 10.

In addition, the substrate with an electrically conductive film 50 of the present invention may also have a base layer formed between the substrate 10 and the multilayer reflective film 21. The base layer can be formed for the purpose of improving smoothness of a main surface of the substrate 10, reducing defects, demonstrating the effect of enhancing reflectance of the multilayer reflective film 21, and compensating for stress in the multilayer reflective film 21.

[Substrate with Electrically Conductive Film 50]

Next, an explanation is provided of the substrate with an electrically conductive film 50 of the present invention. The substrate with an electrically conductive film 50 of the present invention can be obtained as shown in FIG. 4 by forming the prescribed back side electrically conductive film 23 on the side of the substrate with a multilayer reflective film 20 shown in FIG. 3 on the opposite side from the side in contact with the multilayer reflective film 21 of the substrate 10. Furthermore, the substrate with an electrically conductive film 50 of the present invention is not necessarily required to have a multilayer reflective film. As shown in FIG. 2, the substrate with an electrically conductive film 50 of the present invention can also be obtained by forming the prescribed back side electrically conductive film 23 on one of the main surfaces of the mask blank substrate 10. The substrate with an electrically conductive film 50 of the present invention is characterized in that the coefficient of static friction of the surface of the electrically conductive film 23 is a value within a prescribed range.

The method used to form the back side electrically conductive film 23 is known in the art, and can be formed using a target comprised of a metal such as Cr or Ta or an alloy thereof by magnetron sputtering or ion beam sputtering.

In the substrate for an electrically conductive film 50 of the present invention, the electrically conductive film 23 is preferably composed of a material containing at least one material selected from tantalum and chromium. In the substrate with an electrically conductive film 50 of the present invention, the electrically conductive film 23 can be obtained that has electrical properties (sheet resistance) required for use as the back side electrically conductive film 23 of the reflective mask 40 as a result of the electrically conductive film 23 being composed of a material containing at least one material selected from tantalum and chromium.

Preferable examples of materials used for the material of the electrically conductive film 23 containing tantalum (Ta) include Ta (tantalum), alloys containing Ta, and Ta compounds containing at least any one of boron, nitrogen, oxygen and carbon therein. Examples of Ta compounds include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON and TaSiCON.

The material containing chromium (Cr) of the electrically conductive film 23 is preferably a Cr compound containing at least one material selected from boron, nitrogen, oxygen and carbon with Cr. Examples of Cr compounds include CrN, CrON, CrC, CrCN, CrCO, CrCON, CrBN, CrBO, CrBON, CrBC, CrBCN, CrBOC and CrBOCN.

A material containing tantalum (Ta) or chromium (Cr) used for the electrically conductive film 23 preferably has a low content of nitrogen (N) present in the surface layer thereof. More specifically, the nitrogen content of the surface layer of the electrically conductive film 23 containing tantalum (Ta) or chromium (Cr) is preferably less than 5 at %, and the surface layer thereof is more preferably substantially free of nitrogen. This is because, in the electrically conductive film 23 composed of a material containing tantalum (Ta) or chromium (Cr), a lower nitrogen content of the surface layer thereof results in a higher coefficient of static friction and wear resistance.

The nitrogen content of the electrically conductive film 23 is preferably low at least in a portion at a film thickness of 10 nm from the surface thereof, and is more preferably low in a portion at a film thickness of 30 nm from the surface. In addition, nitrogen is more preferably not contained throughout the entire electrically conductive film 23 composed of a material containing tantalum (Ta) or chromium (Cr) from the viewpoint of coefficient of static friction.

Nitrogen content in the electrically conductive film 23 may be such that a graded composition is employed in which nitrogen content changes in the direction of thickness of the electrically conductive film 23 so that nitrogen content is higher on the side of the substrate 10 and lower on the surface.

In the substrate with an electrically conductive film 50 of the present invention, the electrically conductive film 23 is preferably composed of a material containing tantalum and boron. The electrically conductive film 23 can be obtained that demonstrates wear resistance and chemical resistance as a result of being composed of material that contains tantalum and boron.

In the case the electrically conductive film 23 contains tantalum (Ta) and boron (B), the content of B is preferably 5 at % to 30 at %. The ratio of Ta to B (Ta:B) in a sputtering target used to deposit the electrically conductive film 23 is preferably 95:5 to 70:30.

In order for an electrostatic chuck to operate properly, the sheet resistance of the electrically conductive film 23 is preferably not more than 200Ω/□ (Ω/square), more preferably not more than 100 Ω/square, even more preferably not more than 75 Ω/square, and particularly preferably not more than 50 Ω/square. The electrically conductive film having suitable sheet resistance can be obtained by adjusting the composition and film thickness of the electrically conductive film 23.

Film thickness of the electrically conductive film 23 can be suitably controlled within a range that allows obtaining of the aforementioned sheet resistance. The film thickness of the electrically conductive film 23 is preferably not less than 10 nm and more preferably not less than 20 nm. In addition, film thickness of the electrically conductive film 23 is preferably not more than 200 nm and more preferably not more than 100 nm from the viewpoint of surface roughness.

The method used to form the back side electrically conductive film 23 is preferably such that the electrically conductive film 23 is deposited by sputtering using a sputtering target containing a metal used as an electrically conductive film material. More specifically, the back side electrically conductive film 23 is preferably deposited by rotating the substrate 10 over the horizontal plane with the deposited surface of the substrate 10 for forming the back side electrically conductive film 23 facing upward, and sputtering a sputtering target in opposition to the deposited surface while inclined at a prescribed angle at a location of a straight line parallel the central axis of the substrate 10 that passes through the center of the sputtering target, and straight line being offset from the central axis of the substrate 10. The prescribed angle is preferably such that the angle of inclination of the sputtering target is 5 degrees to 30 degrees. In addition, gas pressure during sputter deposition is preferably 0.03 Pa to 0.5 Pa. Deposition of the electrically conductive film 23 according to this sputtering method makes it possible to make the coefficient of friction and surface roughness (Rms) of the back side electrically conductive film 23 to be within prescribed ranges.

In the case of using a rare gas for the gas used during sputter deposition, by using a gas such as krypton (Kr) and/or xenon (Xe) having a larger atomic weight than argon (Ar), the real contact area of the surface of the electrically conductive film 23 can be increased, and the coefficient of static friction is thought to be able to be increased as a result thereof. As a result, frictional force (the coefficient of static friction) between the surface of the electrically conductive film 23 and the sticking holding surface of the electrostatic chuck of an exposure apparatus can be increased, thereby making it possible to inhibit positional shift of the reflective mask 40 during pattern transfer.

The substrate with an electrically conductive film 50, the substrate with a multilayer reflective film 20 and the reflective mask blank 30 of the present invention are preferably provided with a hydrogen penetration inhibiting film, which inhibits penetration of hydrogen from the substrate 10 (glass substrate) into the electrically conductive film 23, between the mask blank substrate 10 in the form of a glass substrate and the electrically conductive film 23 containing tantalum or chromium. The presence of this hydrogen penetration inhibiting film makes it possible to inhibit increases in compressive stress in the electrically conductive film 23 by being able to inhibit the incorporation of hydrogen in the electrically conductive film 23.

The material of the hydrogen penetration inhibiting film may be any type of material provided it is a material that is resistant to permeation of hydrogen and is able to inhibit penetration of hydrogen from the substrate 10 (glass substrate) into the electrically conductive film 23. Specific examples of materials of the hydrogen penetration inhibiting film include Si, $SiO_2$, SiON, SiCO, SiCON, SiBO, SiBON, Cr, CrN, CrON, CrC, CrCN, CrCO, CrCON, Mo, MoSi, MoSiN, MoSiO, MoSiCO, MoSiON, MoSiCON, TaO and TaON. The hydrogen penetration inhibiting film can be a single layer of these materials or may consist of a plurality of layers and a composition gradient film.

The hydrogen penetration inhibiting film of the substrate with a multilayer reflective film 20 of the present invention is preferably composed of a material containing at least one material selected from silicon, chromium and molybdenum, or a material containing at least one material selected from these elements as well as at least one selected from oxygen, nitrogen and carbon, and is substantially free of hydrogen. As a result of the hydrogen penetration inhibiting film being composed of the aforementioned materials, the passage of hydrogen through the hydrogen penetration inhibiting film can be reduced. Consequently, penetration of hydrogen from the substrate 10 (glass substrate) into the electrically conductive film 23 can be inhibited. As a result, use of the substrate with a multilayer reflective film 20 of the present invention allows the obtaining of the substrate with a multilayer reflective film 20 (substrate with an electrically conductive film 50) for EUV lithography in which flatness is inhibited from changing over time.

The hydrogen penetration inhibiting film may be formed with a material containing silicon and oxygen. In the case of a hydrogen penetration inhibiting film formed with a material containing silicon and oxygen, the ratio of silicon and oxygen in the material is preferably 1:1 to 1:2. If the ratio of oxygen in the material is higher than that of silicon, the abundance ratios of unbound silicon with oxygen become high and it is difficult to obtain the effect of inhibiting penetration of hydrogen. In the case of forming a hydrogen penetration inhibiting film composed of a material containing silicon and oxygen by sputtering, since the electrical conductivity of the sputtering target is low, the hydrogen penetration inhibiting film formed is susceptible to the occurrence of defects. In consideration thereof, the hydrogen penetration inhibiting film is preferably formed by RF sputtering or ion beam sputtering.

The material of the hydrogen penetration inhibiting film is preferably a material that contains tantalum and oxygen in order to reliably inhibit penetration of hydrogen into the electrically conductive film 23. Preferable examples of the material of the hydrogen penetration inhibiting film include TaO, TaON and TaBO. The material of the hydrogen penetration inhibiting film is more preferably a material selected from TaO, TaON and TaBO in which the oxygen content is not less than 50 at %. The hydrogen penetration inhibiting film may be a single layer of these materials or may consist of a plurality of layers and a composition gradient film.

The crystal structure of the hydrogen penetration inhibiting film is microcrystalline and preferably amorphous. Such a hydrogen penetration inhibiting film is unlikely to have a single crystal structure, but rather easily adopts a mixture of a plurality of crystal structures. Consequently, the hydrogen penetration inhibiting film easily enters a state in which oxygen and unbound Ta, TaO bonds, $Ta_2O_3$ bonds, $TaO_2$ bonds and $Ta_2O_5$ bonds are present in the form of a mixture (mixed state). As the abundance ratio of unbound Ta with oxygen increases, hydrogen is incorporated more easily and hydrogen easily passes through the film. By containing oxygen in the hydrogen penetration inhibiting film at no less than 50 at %, all tantalum present in the film theoretically bonds with oxygen. In addition, the ratio at which unbound tantalum with oxygen is thought to be able to be held to a considerably low level even in a mixed state as previously described. Thus, in order to reliably inhibit penetration of hydrogen from the substrate 10 (glass substrate) into the electrically conductive film 23, the hydrogen penetration inhibiting film preferably contains oxygen at not less than 50 at %.

The thickness of the hydrogen penetration inhibiting film is preferably not less than 1 nm, more preferably not less than 5 nm, and even more preferably not less than 10 nm. In the case the thickness of the hydrogen penetration inhibiting film is less than 1 nm, the hydrogen penetration inhibiting film cannot be expected to demonstrate the effect of preventing penetration of hydrogen as a result of being excessively thin. In addition, in the case the thickness of the hydrogen penetration inhibiting film is less than 1 nm, it is not easy to form a film on a main surface 2 of the substrate 10 (glass substrate) that has a nearly uniform film thickness and nearly homogeneous film composition even if the film is deposited by sputtering.

The hydrogen penetration inhibiting film is preferably formed in the same region as the region where the electrically conductive film 23 is formed on the main surface 2 of the substrate 10 (glass substrate), or in a region that is larger than the region where the electrically conductive film 23 is formed, so that the electrically conductive film 23 does not contact the substrate 10 (glass substrate).

[Reflective Mask Blank 30]

Next, an explanation is provided of the reflective mask blank 30 of the present invention. FIG. 5 is a schematic diagram showing an example of the reflective mask blank 30 of the present invention. The reflective mask blank 30 of the present invention employs a configuration in which an absorber film 24 serving as a transfer pattern is formed on the previously explained multilayer reflective film 21 or protective film 22 of the substrate with a multilayer reflective film 20.

Since the absorber film 24 of the reflective mask blank 30 is able to absorb EUV light, the reflective mask 40 (EUV mask) can be fabricated by patterning the absorber film 24 of the reflective mask blank 30.

The aforementioned absorber film 24 has a function that absorbs exposure light in the form of EUV light, and has a desired difference in reflectance between light reflected by the aforementioned multilayer reflective film 21 and/or the protective film 22 and light reflected by an absorber pattern 27 in the reflective mask 40 fabricated using the reflective mask blank 30.

For example, reflectance with respect to EUV light of the absorber film 24 is set to between 0.1% and 40%. Moreover, in addition to the aforementioned difference in reflectance, the absorber film 24 may also have a desired phase difference between light reflected by the aforementioned multilayer reflective film 21 and/or the protective film 22 and light reflected by the absorber pattern 27. Furthermore, in the case of having such a desired phase difference between the reflected lights, the absorber film 24 in the reflective mask blank 30 may be referred to as a phase shift film. In the case of improving the contrast of reflected light of the resulting reflective mask 40 by providing the aforementioned desired phase difference between the reflected lights, the phase difference is preferably set to within the range of 180 degrees±10 degrees, the absolute reflectance of the absorber film 24 is preferably set to 1.5% to 30%, and the reflectance of the absorber film 24 with respect to the surface of the multilayer reflective film 21 and/or the protective film 22 is preferably set to 2% to 40%.

The aforementioned absorber film 24 may be a single layer or a multilayered structure. In the case of a multilayered structure, the laminated films may be of the same material or different materials. The laminated film can be that in which the materials and/or composition change incrementally or continuously in the direction of film thickness.

There are no particular limitations on the material of the aforementioned absorber film 24. For example, a material having the function of absorbing EUV light that is composed of Ta (tantalum) alone or a material having Ta as the main component thereof is used preferably. A material having Ta as the main component thereof is normally a Ta alloy. The crystalline state of this absorber film 24 is such that it preferably has an amorphous or microcrystalline structure from the viewpoints of smoothness and flatness. Materials selected from materials containing Ta and B, materials containing Ta and N, materials containing Ta and B and further containing at least O or N, materials containing Ta and Si, materials containing Ta, Si and N, materials containing Ta and Ge, and materials containing Ta, Ge and N can be used as materials having Ta as the main component thereof. In addition, an amorphous structure is easily obtained by adding, for example, B, Si and/or Ge to Ta, thereby making it possible to improve smoothness. Moreover, if N and/or O are added to Ta, resistance to oxidation improves, thereby making it possible to improve stability over time. The absorber film preferably has a microcrystalline structure of amorphous structure. Crystal structure can be confirmed with an X-ray diffraction (XRD) analyzer.

More specifically, examples of materials containing tantalum used to form the absorber film 24 include tantalum metal and materials containing tantalum along with at least one element selected from nitrogen, oxygen, boron and carbon and are substantially free of hydrogen. Examples thereof include Ta, TaN, TaON, TaBN, TaBON, TaCN, TaCON, TaBCN and TaBOCN. The aforementioned materials may also contain a metal other than tantalum within a range that allows the effects of the present invention to be obtained. The containing of boron in the material containing tantalum used to form the absorber film 24 facilitates control so that the absorber film 24 adopts an amorphous structure.

The absorber film 24 of the reflective mask blank 30 of the present invention is preferably formed with a material containing tantalum and nitrogen. The nitrogen content in the absorber film 24 is preferably not more than 30 at %, more preferably not more than 25 at %, and even more preferably not more than 20 at %. The nitrogen content in the absorber film 24 is preferably not less than 5 at %.

In the reflective mask blank 30 of the present invention, the absorber film 24 preferably contains tantalum and nitrogen, and the nitrogen content is preferably 10 at % to 50 at %. As a result of the absorber film 24 containing tantalum and nitrogen and the nitrogen content thereof being 10 at % to 50 at %, enlargement of crystal grains that compose the absorber film 24 can be inhibited, thereby making it possible to lower pattern edge roughness when patterning the absorber film 24.

In the reflective mask blank 30 of the present invention, the film thickness of the absorber film 24 is set to the film thickness required for the absorber film 24 to have a desired difference in reflectance between light reflected by the multilayer reflective film 21 or the protective film 22 and light reflected by the absorber pattern 27. The film thickness of the absorber film 24 is preferably not more than 60 nm in order to reduce shadowing effects.

In addition, in the reflective mask blank 30 of the present invention, the aforementioned absorber film 24 can have a phase shift function having a desired phase shift difference between light reflected by the aforementioned multilayer reflective film 21 or the protective film 22 and light reflected by the absorber pattern 27. In that case, the resulting reflective mask blank 30 serves as the master of the reflective mask 40 having improved transfer resolution by EUV light. In addition, since the film thickness of the absorber film 24 required to demonstrate a phase shift effect needed to demonstrate desired transfer resolution can be reduced in comparison with that in the prior art, a reflective mask blank is obtained in which shadowing effects are reduced.

There are no particular limitations on the material of the absorber film 24 having a phase shift function. For example, Ta alone or a material having Ta as the main component thereof can be used as previously described, or another material may be used. Examples of materials other than Ta include Ti, Cr, Nb, Mo, Ru, Rh and W. In addition, an alloy containing two or more elements among Ta, Ti, Cr, Nb, Mo, Ru, Rh and W can be used for the material or a laminated film consisting of these elements can be used. In addition, one or more elements selected from nitrogen, oxygen and carbon may also be contained in these materials.

Furthermore, in the case of using the absorber film 24 in the form of a laminated film, the laminated film may be a laminated film consisting of layers of the same material or a laminated film consisting of layers of different materials. In the case of using a laminated film consisting of layers of different materials for the absorber film 24, the materials that compose this plurality of layers may be materials having mutually different etching properties to obtain the absorber film 24 having an etching mask function.

Furthermore, the reflective mask blank 30 of the present invention is not limited to the configuration shown in FIG. 5. For example, a resist film serving as a mask for patterning the aforementioned absorber film 24 can also be formed on the absorber film 24, and this reflective mask blank 30 with a resist film can also constitute the reflective mask blank 30 of the present invention. Furthermore, the resist film formed on the absorber film 24 may be a positive resist or negative resist. In addition, the resist film may be for electron beam drawing or laser drawing. Moreover, a so-called hard mask film (etching mask film 25) can also be formed between the absorber film 24 and the aforementioned resist film, and this aspect can also constitute the reflective mask blank 30 of the present invention.

The reflective mask blank 30 of the present invention is such that the mask blank multilayer film 26 preferably further contains a hard mask film 25 arranged in contact with the surface of the absorber film 24 on the opposite side from the mask blank substrate 10. In the case of the reflective mask blank 30 shown in FIG. 7, the mask blank multilayer film 26 on a main surface of the mask blank substrate 10 additionally has the etching mask film 25 in addition to the multilayer reflective film 21, the protective film 22 and the absorber film 24. The reflective mask blank 30 of the present invention is able to further have a resist film on the uppermost surface of the mask blank multilayer film 26 of the reflective mask blank 30 shown in FIG. 7.

More specifically, in the case the reflective mask blank 30 of the present invention uses Ta alone or a material having Ta as the main component thereof for the material of the absorber film 24, it preferably has a structure in which the etching mask film 25 composed of a material containing chromium is formed on the absorber film 24. The use of a reflective mask blank 30 having such a structure makes it possible to fabricate the reflective mask 40 having favorable optical properties for the absorber pattern 27 even if the etching mask film 25 is stripped by dry etching using a mixed gas of a chlorine-based gas and oxygen gas following formation of a transfer pattern on the absorber film 24. In addition, the reflective mask 40 can be fabricated to have favorable line edge roughness of a transfer pattern formed on the absorber film 24.

Examples of materials containing tantalum used to form the etching mask film 25 include materials containing chromium along with one or more elements selected from nitrogen, oxygen, carbon and boron. Examples of materials containing chromium used to form the etching mask film 25 include CrN, CrON, CrCN, CrCON, CrBN, CrBON, CrBCN and CrBOCN. The aforementioned materials may also contain metals other than chromium within a range that allows the effects of the present invention to be obtained. The film thickness of the etching mask film 25 is preferably not less than 3 nm from the viewpoint of functioning as an etching mask that precisely forms a transfer pattern of the absorber film 24. In addition, the film thickness of the etching mask film 25 is preferably not more than 15 nm from the viewpoint of reducing film thickness of the resist film.

Next, an explanation is provided of the method of fabricating the reflective mask blank 30 of the present invention using, as starting material, the substrate with a multilayer reflective film 20 shown in FIG. 4. In the method of fabricating the reflective mask blank 30 of the present invention, the absorber film 24 is formed on the multilayer reflective film 21 formed on a main surface of the mask blank substrate 10. Furthermore, in the case of using the substrate with a multilayer reflective film 20 shown in FIG. 2, the prescribed back side electrically conductive film 23 is formed on the back side of the substrate 10 as previously described.

In the method of fabricating the reflective mask blank 30 of the present invention, in the step for forming the absorber film 24, the absorber film 24 is formed by reactive sputtering using a sputtering target composed of a material contained in the absorber film 24, and the absorber film 24 is preferably formed so that a component contained in the atmospheric gas during reactive sputtering is contained therein. When depositing by reactive sputtering, surface morphology can be adjusted to a desired shape by adjusting the flow rate of the atmospheric gas.

In the case of forming the absorber film 24 by reactive sputtering, the atmospheric gas is preferably a mixed gas containing an inert gas and nitrogen gas. In this case, the absorber film 24 can be obtained that has a suitable composition since the flow rate of nitrogen can be adjusted.

In the method of fabricating the reflective mask blank 30 of the present invention, the absorber film 24 is preferably formed using a sputtering target of a material containing tantalum. As a result, the absorber film 24 can be formed that contains tantalum and suitably absorbs light.

The method of fabricating the reflective mask blank 30 of the present invention preferably further comprises a step for forming the protective film 22 arranged in contact with the surface of the multilayer reflective film 21. As a result of forming the protective film 22, damage to the surface of the multilayer reflective film 21 during fabrication of the reflective mask 40 (EUV mask) can be inhibited, thereby further improving reflectance properties with respect to EUV light.

The protective film 22 is preferably formed by ion beam sputtering in which an ion beam is emitted onto the material of the protective film 22. Since the surface of the protective film 22 is smoothened by ion beam sputtering, the surface of the absorber film 24 formed on the protective film 22, and in turn the surface of the etching mask film 25 formed on the absorber film 24, can be smoothened.

The method of fabricating the reflective mask blank 30 of the present invention preferably further comprises a step for forming the etching mask film 25 arranged in contact with the surface of the absorber film 24. As a result of forming the etching mask film 25 having different dry etching properties than the absorber film 24, a highly precise transfer pattern can be formed when forming a transfer pattern on the absorber film 24.

[Reflective Mask 40]

Figure 6:
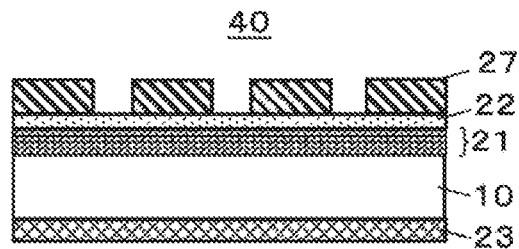
FIG. 6 is a cross-sectional schematic diagram showing one example of a reflective mask according to one embodiment of the present invention.

The following provides an explanation of the reflective mask 40 according to one embodiment of the present invention. FIG. 6 is a schematic diagram showing the reflective mask 40 of the present embodiment.

The reflective mask 40 of the present invention employs a configuration in which the absorber pattern 27 is formed on the aforementioned multilayer reflective film 21 or the protective film 22 by patterning the absorber film 24 on the aforementioned reflective mask blank 30. The reflective mask 40 of the present embodiment can be used as a reflective mask 40 for lithography as a result of exposure light such as EUV light being absorbed at the portion of the reflective mask 40 of the present embodiment where the absorber film 24 is present, but being reflected by the exposed protective film 22 and multilayer reflective film 21 at other portions where the absorber film 24 have been removed, when the reflective mask 40 is exposed to the exposure light.

According to the reflective mask 40 of the present invention, as a result of having an absorber pattern 27 on the multilayer reflective film 21 (or the protective film 22), a prescribed pattern can be transferred to a transferred substrate using EUV light. In addition, positional shift of the reflective mask 40 can be inhibited during pattern transfer in a pattern transfer apparatus even in the case of increasing the movement speed of the stage on which the reflective mask 40 is placed.

[Method of Manufacturing Semiconductor Device]

A semiconductor device, having various patterns formed on a semiconductor substrate or other transferred substrate, can be manufactured by transferring a transfer pattern, such as a circuit pattern, based on the absorber pattern 27 of the reflective mask 40, to a resist film formed on a semiconductor substrate or other transferred substrate by using the previously explained reflective mask 40 and a lithography process using an exposure apparatus, followed by going through various other steps.

Namely, the present invention is a method of manufacturing a semiconductor device having a step for forming a transfer pattern on a transferred substrate by carrying out a lithography process with an exposure apparatus using the aforementioned reflective mask 40.

According to the method of manufacturing a semiconductor device of the present invention, a semiconductor device having a fine and highly precise transfer pattern can be manufactured since positional shift of the reflective mask 40 can be inhibited during pattern transfer.

Examples

The following provides an explanation of examples of fabricating the substrate with an electrically conductive film 50, the substrate with a multilayer reflective film 20, the reflective mask blank 30 and the reflective mask 40 of the present invention.

<Substrate with Electrically Conductive Film 50 of Examples 1 to 5 and Comparative Example 1>

First, the multilayer reflective film 21 was deposited on the surface of the mask blank substrate 10 for EUV exposure in the manner described below to fabricate substrates with an electrically conductive film 50 of Examples 1 to 5 and Comparative Example 1.

<Fabrication of Mask Blank Substrate 10>

Mask blank substrates 10 used to fabricate the substrates for an electrically conductive film of Examples 1 to 5 and Comparative Example 1 were fabricated in the manner described below.

An $SiO_2$—$TiO_2$-based glass substrate having a size of 152 mm×152 mm and a thickness of 6.35 mm was prepared for use as the mask blank substrate 10, and the front and back surfaces of the glass substrate were sequentially polished with cerium oxide abrasive particles and colloidal silica abrasive particles using a double-sided polishing apparatus followed by treating the surfaces with a low concentration of hydrofluorosilicic acid. Measurement of the surface roughness of the resulting glass substrate surface with an atomic force microscope yielded a root mean square roughness (Rms) of 0.5 nm.

The surface morphology (surface form, flatness) and total thickness variation (TTV) of regions measuring 148 mm×148 mm on the front and back surfaces of the glass substrate were measured with a wavelength-shifting interferometer using a wavelength-modulating laser. As a result, the flatness of the front and back surfaces of the glass substrate was 290 nm (convex shape). The results of measuring the surface morphology (flatness) of the glass substrate surface were stored in a computer in the form of height information with respect to a reference surface for each measurement point, compared with a reference value of 50 nm (convex shape) for the flatness of the front surface and a reference value of 50 am for the flatness of the back surface required by glass substrates, and the differences therewith (required removal amounts) were calculated by computer.

Next, processing conditions for local surface processing were set corresponding to the required removal amounts for each processing spot-shaped region on the surface of the glass substrate. A dummy substrate was preliminarily processed at a spot in the same manner as actual processing without moving the substrate for a fixed period of time, the morphology thereof was measured with the same measuring instrument as the apparatus used to measure the surface morphology of the aforementioned front and back surfaces, and the processing volume per unit time of the spot was calculated. The scanning speed during Raster scanning of the glass substrate was then determined in accordance with the required removal amount obtained from the spot information and surface morphology information of the glass substrate.

Surface morphology was adjusted by carrying out local surface processing treatment in accordance with the set processing conditions by magnetorheological finishing (MRF) using a substrate finishing apparatus employing a magnetorheological fluid so that the flatness of the front and back surfaces of the glass substrate was not more than the aforementioned reference values. Furthermore, the magnetorheological fluid used at this time contained an iron component, and the polishing slurry used an aqueous alkaline solution containing about 2% by weight of an abrasive in the form of cerium oxide. Subsequently, the glass substrate was immersed in a cleaning tank containing an aqueous hydrochloric acid solution having a concentration of about 10% (temperature: about 25° C.) for about 10 minutes followed by rinsing with pure water and drying with isopropyl alcohol (IPA).

Measurement of the surface morphology (surface form, flatness) of the resulting glass substrate surface yielded flatness for the front and back surfaces of about 40 nm to 50 nm. In addition, when surface roughness of the glass substrate surface was measured using an atomic force microscope in a region measuring 1 μm×1 μm at an arbitrary location of the transfer pattern formation region (132 mm×132 mm), root mean square roughness (Rms) was 0.37 nm, indicating a rough state attributable to surface roughness prior to local surface processing by MRF.

Consequently, double-sided polishing was carried out on the front and back surfaces of the glass substrate using a double-sided polishing apparatus under polishing conditions that maintain or improve the surface morphology of the glass substrate surface. Finishing polishing was carried out under the polishing conditions indicated below.

Machining fluid: Aqueous alkaline solution (NaOH)+ abrasive (concentration: about 2% by weight)
Abrasive: Colloidal silica, mean particle diameter: about 70 nm
Polishing surface plate rotating speed: About 1 rpm to 50 rpm
Processing pressure: About 0.1 kPa to 10 kPa
Polishing time: About 1 minute to 10 minutes Subsequently, the glass substrate was cleaned with an aqueous alkaline solution (NaOH) to obtain the mask blank substrate 10 for EUV exposure.

When the flatness and surface roughness of the front and back surfaces of the resulting mask blank substrate 10 were measured, the flatness on the front and back surfaces was about 40 nm, indicating that the state prior to processing with the double-sided polishing apparatus was favorably maintained or improved. In addition, when a 1 µm×1 µm region at an arbitrary location of the transfer pattern formation region (132 mm×132 mm) of the resulting mask blank substrate 10 was measured with an atomic force microscope, root mean square roughness (Rms) was 0.13 nm.

Furthermore, the local processing method used for the mask blank substrate 10 in the present invention is not limited to the aforementioned magnetorheological finishing. A processing method using gas cluster ion beams (GCIB) or localized plasma may also be used.

The mask blank substrates 10 used in Examples 1 to 5 and Comparative Example 1 were fabricated in the manner described above.

<Fabrication of Back Side Electrically Conductive Film 23>

A back side electrically conductive film 23 was formed in the manner indicated below by DC magnetron sputtering on one of the surfaces (surface corresponding to the back side where the multilayer reflective film 21 is not formed) of the aforementioned mask blank substrates 10 of Examples 1 to 5 and Comparative Example 1. The composition of the back side electrically conductive film 23 formed, deposition conditions, film thickness and other parameters are shown in Table 1. Furthermore, a hydrogen penetration inhibiting film having the composition shown in Table 2 was formed by DC magnetron sputtering prior to form the back side electrically conductive film 23 in Examples 1 to 4. A hydrogen penetration inhibiting film was not formed in Example 5 and Comparative Example 1.

The back side electrically conductive films 23 of Examples 1 to 5 and Comparative Example 1 were deposited in the manner indicated below. Namely, sputtering (or reactive sputtering) was carried out using the prescribed gas shown in Table 1 for the deposition gas with the targets having the compositions shown in Table 1 in opposition to the back side (one surface) of the mask blank substrate 10. The film thickness of the back side electrically conductive films was made to be 70 nm by adjusting the deposition time of the back side electrically conductive films 23. Substrates having an electrically conductive film 50 having the structure shown in FIG. 2 were fabricated in the manner described above.

TABLE 1

|  |  | Example 1 | Example 2 | Example 3 | Example 4 | Example 5 | Comparative Example 1 |
|---|---|---|---|---|---|---|---|
| Electroconductive film composition |  | TaB | TaBN | TaN | CrN | TaB | CrN |
| Sputtering target atomic ratio | Ta | 80 | 80 | 100 | — | 80 | — |
|  | B | 20 | 20 | — | — | 20 | — |
|  | Cr | — | — | — | 100 | — | 100 |
| Sputtering deposition gas components, flow rate ratio and gas pressure | Ar gas | — | — | — | — | — | 80% flow rate |
|  | Kr gas | — | — | — | 80% flow rate | — | — |
|  | Xe gas | 100% flow rate | 66% flow rate | 66% flow rate | — | 100% flow rate | — |
|  | $N_2$ gas | — | 34% flow rate | 34% flow rate | 20% flow rate | — | 20% flow rate |
|  | Gas pressure | 0.07 Pa | 0.07 Pa | 0.07 Pa | 0.05 Pa | 0.07 Pa | 0.05 Pa |
| Electroconductive film thickness |  | 70 nm | 70 nm | 70 nm | 70 nm | 70 nm | 70 nm |
| Surface roughness (Rms) |  | 0.327 nm | 0.343 nm | 0.272 nm | 0.268 nm | 0.327 nm | 0.291 nm |
| Sheet resistance |  | 33 Ω/☐ | 32 Ω/☐ | 32 Ω/☐ | 18 Ω/☐ | 33 Ω/☐ | 16 Ω/☐ |
| Coefficient of static friction |  | 0.35 | 0.25 | 0.26 | 0.28 | 0.35 | 0.22 |
| Wear resistance (specific wear rate) [×10E−7 $mm^3$/Nmm]) |  | 0.00 | 0.00 | 0.00 | 5.00 | 0.00 | 5.50 |

TABLE 2

|  | Example 1 | Example 2 | Example 3 | Example 4 |
|---|---|---|---|---|
| Hydrogen penetration inhibiting film composition | TaBO | TaBO | TaO | TaO |
| Sputtering target compostion | Same as Example 1 | Same as Example 2 | Same as Example 3 | Same as Example 3 |
| Sputtering deposition gas components and flow rates — Ar gas | 67% flow rate | 67% flow rate | 67% flow rate | 67% flow rate |
| O$_2$ gas | 33% flow rate | 33% flow rate | 33% flow rate | 33% flow rate |
| Total flow rate | 85.6 sccm | 85.6 sccm | 85.6 sccm | 85.6 sccm |
| Hydrogen penetration inhibiting film thickness | 2 nm | 2 nm | 2 nm | 2 nm |

<Measurement of Coefficient of Friction>

The substrates for an electrically conductive film 50 of Examples 1 to 5 and Comparative Example 1 were arranged as measured objects 101 in the friction coefficient measuring apparatus shown in FIG. 9. A probe obtained by forming a TiN thin film (thickness: 2.3 μm) on the surface of a quartz piano-convex lens having a radius of curvature of 322 mm was used for the probe 103. The relative speed of movement of the probe 103 relative to the measurement target film (electrically conductive film 23) of the measured object 101 was set to 0.1 mm/sec. In addition, the load for applying vertical compressive stress was set to 10 mN. These values for coefficient of friction were measured in air at a temperature of 20° C. to 23° C. and humidity (RH) of 20% to 30%. An example of the results of measuring the coefficient of static friction of the substrate with an electrically conductive film 50 of Example 3 (TaN electrically conductive film 23) is shown in FIG. 10. In FIG. 10, the maximum value of the coefficient of friction immediately before the waveform begins to decrease after demonstrating a monotonic increase starting at 0 seconds was taken to be the coefficient of static friction of that measurement. Measurements were carried out 3 times on a single sample, and the average value thereof was taken to be the coefficient of static friction of that sample.

The resulting values for the coefficient of static friction and surface roughness (Rms) of the substrates for an electrically conductive film 50 of Examples 1 to 5 and Comparative Example 1 are shown in Table 1. As is clear from Table 1, the coefficients of static friction of the samples of Examples 1 to 5 were not less than 0.25. On the other hand, the coefficient of static friction of the sample of Comparative Examples 1 was less than 0.25. In addition, when a region measuring 1 μm×1 μm at an arbitrary location in a region measuring 142 mm×142 mm, which would be clamped with an electrostatic chuck when placed an exposure apparatus, was measured using an atomic force microscope, the values for surface roughness (Rms) of the samples of Examples 1 to 5 and Comparative Example 1 were not more than 0.60 nm.

<Measurement of Specific Wear Rate>

The method used to calculate specific wear rate was as indicated below. First, the probe was pressed against the flat measurement target (substrate with electrically conductive film 50) at a fixed load, and repeatedly slid back and forth over a fixed distance. The wear area and wear depth of the portion of the measurement target surface over which the probe was slid back and forth were measured to calculate the wear volume. The value obtained by dividing the wear volume by the load and total sliding distance is the specific wear rate. In other words, the specific wear rate is the wear volume per unit load and unit distance.

The resulting specific wear rates of the substrates with an electrically conductive film 50 of Examples 1 to 5 and Comparative Example 1 are shown in Table 1. As is clear from Table 1, the specific wear rates of the samples of Examples 1 to 3 and 5 were 0.00×10$^{-7}$ mm$^3$/Nmm, indicating a high level of wear resistance. In contrast, the specific wear rates of Example 4 and Comparative Example 1 were 5.00×10$^{-7}$ mm$^3$/Nmm and 5.50×10$^{-7}$ mm$^3$/Nmm, respectively, indicating somewhat low levels of wear resistance.

<Substrates with Multilayer Reflective Film 20 of Examples 1 to 5 and Comparative Example 1>

Next, the substrates with a multilayer reflective film 20 of Examples 1 to 5 and Comparative Example 1 were fabricated. The same mask blank substrates 10 as those used to fabricate the previously described substrates with an electrically conductive film 50 of the Examples 1 to 5 and Comparative Example 1 were used for the mask blank substrates 10. The multilayer reflective film 21 was formed on the surfaces of the mask blank substrates 10 followed by forming the electrically conductive film 23 on the back sides thereof.

<Fabrication of Multilayer Reflective Film 21>

Deposition of the multilayer reflective films 21 of the substrates with a multilayer reflective film 20 of Examples 1 to 5 and Comparative Example 1 was carried out in the manner indicated below. Namely, Mo layers (low refractive index layer, thickness: 2.8 nm) and Si layers (high refractive index layer, thickness: 4.2 nm) were alternately laminated (total number of laminated layers: 40 pairs) by ion beam sputtering using an Mo target and Si target to form the multilayer reflective film 21 on the previously described mask blank substrate 10. During deposition of the multilayer reflective film 21 by ion beam sputtering, the incident angle of Mo and Si sputtered particles to the normal of the main surface of the mask blank substrate 10 during ion beam sputtering was 30 degrees and the gas flow rate of the ion source gas was 8 sccm.

Following deposition of the multilayer reflective film 21, an Ru protective film 22 (film thickness: 2.5 nm) was subsequently deposited by ion beam sputtering on the multilayer reflective film 21 in continuation therefrom to obtain the substrate with multilayer reflective film 20. During deposition of the Ru protective film by ion beam sputtering, the incident angle of Ru sputtered particles to the normal of the main surface of the substrate 10 was 40 degrees and the gas flow rate of ion source gas was 8 sccm. The substrates with a multilayer reflective film 20 of Examples 1 to 5 and Comparative Example 1 were fabricated in the manner described above.

<Fabrication of Absorber Film 24>

The absorber films 24 were fabricated by DC magnetron sputtering on the surface of the protective film 22 of the previously described substrates with a multilayer reflective film 20 of Examples 1 to 5 and Comparative Example 1. A laminated absorber film 24 composed of two layers consisting of an absorbing layer in the form of a TaBN film and a low reflecting layer in the form of a TaBO film was used for the absorber film 24. The method used to deposit the absorber films 24 of Examples 1 to 5 and Comparative Example 1 were as indicated below.

First, an absorbing layer in the form of the TaBN film was deposited by DC magnetron sputtering on the surface of the protective film 22 of the aforementioned substrate with a multilayer reflective film 20. The TaBN film was subjected to reactive sputtering in a mixed gas atmosphere of Ar gas and $N_2$ gas with the substrate with a multilayer reflective film 20 positioned in opposition to a TaB mixed sintered target (Ta:B=80:20, atomic ratio). Flow rates of the Ar gas and $N_2$ gas along with other deposition conditions used when depositing the TaBN film are shown in Table 3. Following deposition, the elemental composition of the TaBN film was measured by X-ray photoelectron spectroscopy (XPS). The elemental composition of the TaBN film as measured by XPS, along with the film thickness of the TaBN film, are shown in Table 3. Furthermore, analysis of the crystal structure of the aforementioned TaBN film indicated an amorphous structure.

Next, a TaBO film containing Ta, B and O (low reflecting layer) was additionally formed by DC magnetron sputtering on the TaBN film. This TaBO film was subjected to reactive sputtering in a mixed gas atmosphere of Ar and $O_2$ gas with the substrate with a multilayer reflective film 20 positioned in opposition to a TaB mixed sintered target (Ta:B=80:20, atomic ratio) in the same manner as the first TaBN film. Flow rates of the Ar gas and $N_2$ gas along with other deposition conditions used when depositing the TaBO film are shown in Table 3. Following deposition, the elemental composition of the TaBO film was measured by X-ray photoelectron spectroscopy (XPS). The elemental composition of the TaBO film as measured by XPS, along with the film thickness of the TaBO film, are shown in Table 3. Furthermore, analysis of the crystal structure of the aforementioned TaBO film indicated an amorphous structure. The absorber films 24 (laminated films) of Examples 1 to 5 and Comparative Example 1 were fabricated in the manner described above. Reflective mask blanks 30 having the absorber film 24 were fabricated in this manner.

TABLE 3

| Absorbing Layer | Target material | | TaB mixed sintered target (Ta:B = 80:20, atomic ratio) |
|---|---|---|---|
| | Deposition gas | Ar(sccm) | 12.4 |
| | | $N_2$(sccm) | 6.0 |
| | Film composition (XPS) | | TaBN layer |
| | | Ta (at %) | 74.7 |
| | | B (at %) | 12.1 |
| | | N (at %) | 13.2 |
| | Film thickness(nm) | | 56 |
| Low Reflecting Layer | Target material | | (same as absorbing layer) |
| | Deposition gas | Ar(sccm) | 57.0 |
| | | $O_2$(sccm) | 28.6 |
| | Film composition (XPS) | | TaBO layer |
| | | Ta (at %) | 40.7 |
| | | B (at %) | 6.3 |
| | | O (at %) | 53.0 |
| | Film thickness (nm) | | 14 |
| Total film thickness (nm) | | | 70 |

<Fabrication of Back Side Electrically Conductive Film 23>

A hydrogen penetration inhibiting film and back side electrically conductive film 23 were formed under respectively different conditions on the back side of the aforementioned reflective mask blank 30 where the multilayer reflective film 21 is not formed by DC magnetron sputtering in the same manner as in the case of the aforementioned substrates with an electrically conductive film 50 of Examples 1 to 5 and Comparative Example 1. Parameters including the compositions and film thicknesses of the back side electrically conductive films 23 are shown in Table 1. In addition, the compositions and film thicknesses of the hydrogen penetration inhibiting films are shown in Table 2.

The reflective mask blanks 30 of Examples 1 to 5 and Comparative Example 1 were obtained in the manner described above.

<Fabrication of Reflective Mask 40>

A resist was coated by spin coating onto the surface of the absorber film 24 of the reflective mask blanks 30 of Examples 1 to 5 and Comparative Example 1 followed by going through heating and cooling steps to deposit a resist film having a film thickness of 150 nm. A resist pattern was formed by going through drawing of a desired pattern and development step. The absorber films 24 were patterned by prescribed dry etching using the resist pattern as a mask to form an absorber pattern 27 on the protective film 22. Furthermore, in the case the absorber film 24 is a TaBN film, dry etching can be carried out with a mixed gas of $Cl_2$ and He. In addition, in the case the absorber film is a laminated film composed of two layers consisting of a TaBN film and TaBO film, dry etching can be carried out with a mixture of chlorine ($Cl_2$) and oxygen ($O_2$) gas (mixing ratio (flow rate ratio) of chlorine ($Cl_2$) and oxygen ($O_2$) is 8:2).

Subsequently, the resist film was removed followed by cleaning with a chemical solution in the same manner as previously described to fabricate the reflective masks 40 of Examples 1 to 5 and Comparative Example 1.

<Manufacturing of Semiconductor Device>

As a result of measuring the flatness of the back side of the reflective masks 40 fabricated in Examples 1 to 5 and Comparative Example 1 with a flatness measuring apparatus utilizing optical interference, the mask were confirmed to have flatness over a convex surface of 200 nm.

Figure 11:
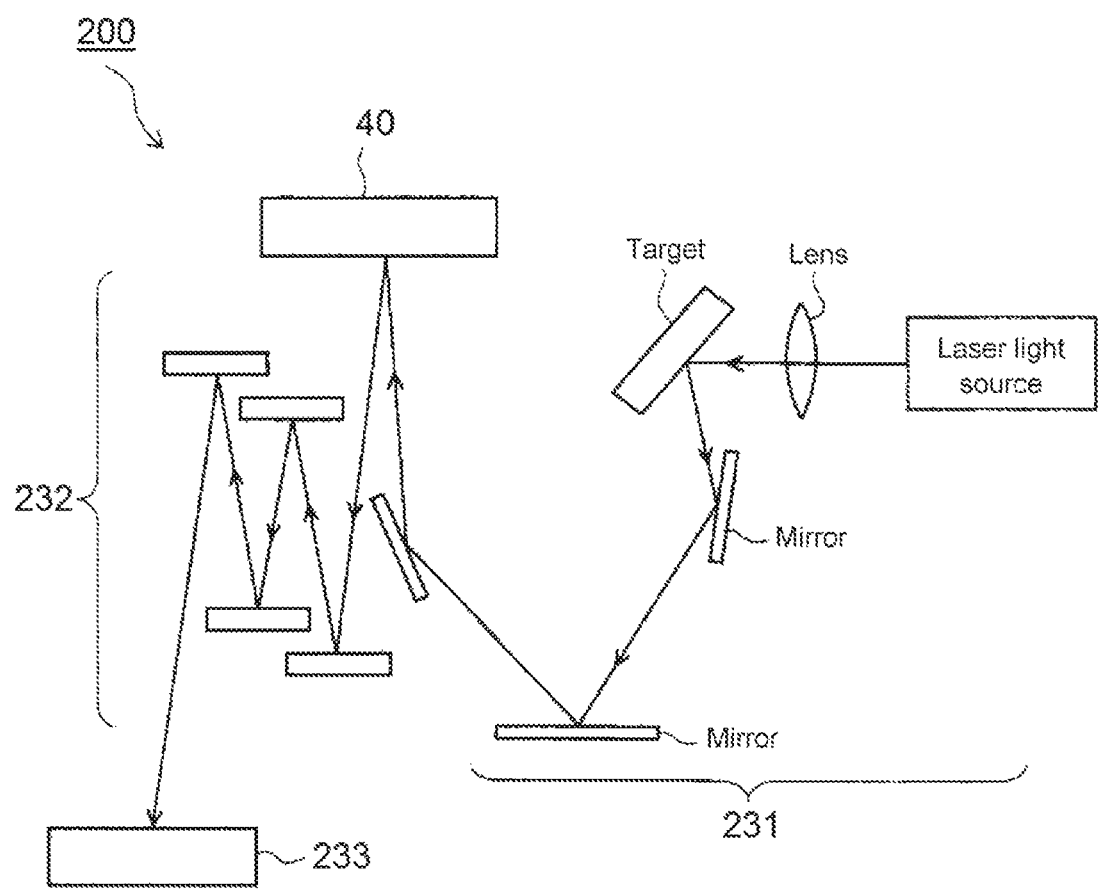
FIG. 11 is a block diagram showing the configuration of a pattern transfer apparatus.

Pattern transfer was carried out on a semiconductor substrate with a pattern transfer apparatus 200 having the configuration shown in FIG. 11 using the reflective masks 40 fabricated in Examples 1 to 5 and Comparative Example 1. As shown in FIG. 11, EUV light (soft X-rays) obtained from a laser plasma X-ray source 231 are emitted onto the reflective mask 40, and the light reflected therefrom is transferred onto a Si wafer substrate 233, for example, through an optical reduction system 232.

An X-ray reflective mirror can be used for the optical reduction system 232, and the pattern reflected from the reflective mask 40 by the optical reduction system is normally reduced to about ¼. For example, transfer of a pattern to the Si substrate of a Si wafer can be carried out by exposing the pattern to a resist film formed on the Si substrate 233 and then developing the pattern. Transfer is normally carried out so that the light path travels through a vacuum in the case of using a wavelength band of 13 nm to 14 nm for the exposure wavelength.

As a result of carrying out pattern transfer onto a semiconductor substrate with the pattern transfer apparatus 200 using the reflective masks 40 obtained in Examples 1 to 5, there was no occurrence of positional shift even in the case of increasing the movement speed of the stage on which the reflective mask 40 is placed, and a pattern having highly precise positional accuracy was confirmed to be able to be formed.

On the other hand, as a result of carrying out pattern transfer onto a semiconductor substrate with the pattern transfer apparatus 200 using the reflective mask 40 fabricated in Comparative Example 1, positional shift occurred following an increase in the movement speed of the stage on which the reflective mask 40 was placed, and pattern transfer was unable to be carried out with high precision.

BRIEF DESCRIPTION OF THE REFERENCE SYMBOLS

- 10 Mask blank substrate
- 20 Substrate with a multilayer reflective film
- 21 Multilayer reflective film
- 22 Protective film
- 23 Electrically conductive film (back side electrically conductive film)
- 24 Absorber film
- 25 Etching mask film
- 26 Mask blank multilayer film
- 27 Absorber pattern
- 30 Reflective mask blank
- 40 Reflective mask
- 50 Substrate with an electrically conductive film
- 101 Measured object
- 102 Shearing movement Y stage
- 103 Probe
- 104 Sample holder
- 105 Surface pressure applying X stage (two type, coarse movement, fine movement)
- 106 Surface pressure-displaced leaf spring
- 107 Displacement sensor for detecting surface pressure
- 108 Frictional force-displaced leaf spring
- 109 Displacement sensor for detecting frictional force
- 110 Measurement position-changing Z stage
- 111 Measurement position-changing X stage
- 200 Pattern transfer apparatus
- 231 Laser plasma X-ray source
- 232 Optical reduction system
- 233 Si substrate

The invention claimed is:

1. A mask blank substrate for EUV lithography, the mask blank substrate comprising a substrate having an electrically conductive film formed on a main surface of the substrate, wherein a coefficient of static friction of an outer surface of the electrically conductive film, as measured by sliding a convex surface along the outer surface, is not less than 0.25.

2. The mask blank substrate according to claim 1, wherein the electrically conductive film is composed of a material comprising at least one material selected from tantalum and chromium.

3. The mask blank substrate according to claim 1, wherein the electrically conductive film comprises tantalum and boron.

4. The mask blank substrate according to claim 1, wherein surface roughness (Rms) of the electrically conductive film is not more than 0.60 nm.

5. The mask blank substrate according to claim 1, comprising a multilayer reflective film formed on a main surface of the substrate at an opposite side of the substrate from the main surface on which the electrically conductive film is formed, wherein the multilayer reflective film is an alternately layered stack of a high refractive index layer and a low refractive index layer.

6. The mask blank substrate according to claim 5, wherein a protective film is formed on the multilayer reflective film.

7. A reflective mask blank having an absorber film formed on the multilayer reflective film of the mask blank substrate according to claim 5.

8. A reflective mask having an absorber pattern, wherein the absorber pattern is a patterned absorber film in the reflective mask blank according to claim 7.

9. A method of manufacturing a semiconductor device comprising forming a transfer pattern on a transferred substrate by carrying out a lithography process with an exposure apparatus using the reflective mask according to claim 8.

10. The mask blank substrate according to claim 2, wherein a nitrogen content of a surface layer of the electrically conductive film is less than 5 at %.

11. The mask blank substrate according to claim 2, wherein a nitrogen content of the electrically conductive film is a graded composition film so that the nitrogen content is higher at the side of the substrate and lower at the outer surface.

12. The mask blank substrate according to claim 2, wherein nitrogen is not contained in the electrically conductive film.

13. The mask blank substrate according to claim 3, wherein a content of boron is 5 at % to 30 at %.

14. The mask blank substrate according to claim 1, comprising an intermediate film between the substrate and the electrically conductive film.

15. The mask blank according to claim 14, wherein the electrically conductive film comprises tantalum and boron, and the intermediate film comprises tantalum and oxygen.

16. A reflective mask blank having an absorber film formed on the protective film of the mask blank substrate according to claim 6.

17. A reflective mask having an absorber pattern, wherein the absorber pattern is a patterned absorber film in the reflective mask blank according to claim 16.

18. A method of manufacturing a semiconductor device comprising forming a transfer pattern on a transferred substrate by carrying out a lithography process with an exposure apparatus using the reflective mask according to claim 17.

19. The mask blank substrate according to claim 1, wherein a thickness of the electrically conductive film is at least forty nanometers and not more than one hundred nanometers.

20. The mask blank substrate according to claim 1, wherein the convex surface is a surface of an electrically conductive material.

\* \* \* \* \*